(12) United States Patent
Oh et al.

(10) Patent No.: US 11,715,413 B2
(45) Date of Patent: Aug. 1, 2023

(54) DISPLAY MODULE, DISPLAY APPARATUS AND METHOD FOR MANUFACTURING THE SAME

(71) Applicant: SAMSUNG ELECTRONICS CO., LTD., Suwon-si (KR)

(72) Inventors: Jongsu Oh, Suwon-si (KR); Daisuke Kawae, Yokohama (JP); Junichi Yamashita, Yokohama (JP); Sangyoung Park, Suwon-si (KR); Hoseop Lee, Suwon-si (KR); Tetsuya Shigeta, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 9 days.

(21) Appl. No.: 17/675,231

(22) Filed: Feb. 18, 2022

(65) Prior Publication Data

US 2022/0172674 A1 Jun. 2, 2022

Related U.S. Application Data

(63) Continuation of application No. PCT/KR2021/016815, filed on Nov. 16, 2021.

(30) Foreign Application Priority Data

Nov. 19, 2020 (KR) .................. 10-2020-0155232

(51) Int. Cl.
*G09G 3/32* (2016.01)
*G09F 9/33* (2006.01)
(Continued)

(52) U.S. Cl.
CPC ............. *G09G 3/32* (2013.01); *G09F 9/3026* (2013.01); *G09F 9/33* (2013.01); *H01L 27/156* (2013.01); *H01L 33/62* (2013.01)

(58) Field of Classification Search
CPC .......... G09F 9/33; G09F 9/3026; G09G 3/32; G09G 2320/045; G09G 2300/0426;
(Continued)

(56) References Cited

U.S. PATENT DOCUMENTS 9,601,517 B2 * 3/2017 Lin ................. H01L 27/156
10,332,868 B2 * 6/2019 Cok ................ H01L 25/167
(Continued)

FOREIGN PATENT DOCUMENTS

GB 2549734 A * 11/2017 ............. G09G 3/006
KR 10-2006-0072316 A 6/2006
(Continued)

OTHER PUBLICATIONS

International Search Report (PCT/ISA/210) dated Mar. 3, 2022 issued in International Application No. PCT/KR2021/016815.

*Primary Examiner* — Vinh T Lam
(74) *Attorney, Agent, or Firm* — Sughrue Mion, PLLC

(57) ABSTRACT

A display module includes a plurality of pixels; a substrate; a plurality of inorganic LEDs arranged on the substrate, each of the plurality of pixels including two or more inorganic LEDs among the plurality of inorganic LEDs; and a plurality of micro-pixel controllers two-dimensionally arranged in a first direction and a second direction on the substrate, each of the plurality of micro-pixel controllers being configured to control two or more pixels among the plurality of pixels. Each micro-pixel controller of the plurality of micro-pixel controllers is electrically connected to micro-pixel controllers adjacent thereto, and is configured to convert a voltage input from one of the micro-pixel controllers that is electrically connected thereto in a direction opposite to the first direction into a target voltage and supply the target voltage
(Continued)

to another micro-pixel controller of the micro-pixel controllers that is electrically connected thereto in the first direction.

20 Claims, 24 Drawing Sheets

(51) Int. Cl.
*H01L 27/15* (2006.01)
*H01L 33/62* (2010.01)
*G09F 9/302* (2006.01)

(58) Field of Classification Search
CPC .... G09G 2320/0233; G09G 2320/0242; H01L 27/156; H01L 33/62; H01L 25/0753; H01L 25/167; G06F 3/1446
See application file for complete search history.

(56) References Cited

U.S. PATENT DOCUMENTS

| | | | |
|---|---|---|---|
| 10,356,858 B2 | 7/2019 | Wu et al. | |
| 10,380,930 B2* | 8/2019 | Cok | G09G 3/2003 |
| 10,453,826 B2* | 10/2019 | Raymond | H01L 25/0753 |
| 10,475,876 B2* | 11/2019 | Bower | H10K 59/129 |
| 10,636,772 B1* | 4/2020 | Ray | H01L 25/0753 |
| 10,930,204 B2* | 2/2021 | He | G09G 3/32 |
| 10,930,231 B2* | 2/2021 | Kim | G09G 3/3607 |
| 11,189,605 B2* | 11/2021 | Bower | H01L 25/165 |
| 11,282,439 B2* | 3/2022 | Cok | H03K 7/08 |
| 11,437,410 B2* | 9/2022 | Lee | H01L 25/0753 |
| 11,488,518 B2* | 11/2022 | Cok | G09G 3/2088 |
| 11,488,943 B2* | 11/2022 | Bower | H01L 23/481 |
| 11,538,849 B2* | 12/2022 | Cok | H01L 33/62 |
| 11,600,218 B2* | 3/2023 | Yokoyama | H05B 33/14 |
| 2005/0219236 A1 | 10/2005 | Sano et al. | |
| 2011/0069094 A1 | 3/2011 | Knapp | |
| 2015/0356918 A1 | 12/2015 | Sakariya et al. | |
| 2016/0099262 A1* | 4/2016 | Lin | H01L 27/124 |
| | | | 257/43 |
| 2018/0158808 A1* | 6/2018 | Zhang | H01L 25/167 |
| 2018/0191978 A1 | 7/2018 | Cok et al. | |
| 2018/0323180 A1 | 11/2018 | Cok | |
| 2019/0244942 A1* | 8/2019 | Yamaguchi | H10K 77/111 |
| 2020/0020676 A1 | 1/2020 | Cok et al. | |
| 2021/0312851 A1* | 10/2021 | Illek | G09G 3/2003 |
| 2022/0069154 A1* | 3/2022 | Bower | H01L 31/173 |

FOREIGN PATENT DOCUMENTS

| | | |
|---|---|---|
| KR | 10-0766625 B1 | 10/2007 |
| KR | 10-1971979 B1 | 4/2019 |
| KR | 10-2019-0067180 A | 6/2019 |

* cited by examiner

DISPLAY MODULE, DISPLAY APPARATUS AND METHOD FOR MANUFACTURING THE SAME

CROSS-REFERENCE TO RELATED APPLICATIONS

This application is a bypass continuation of International Application No. PCT/KR2021/016815, filed on Nov. 16, 2021, which is based on and claims priority to Korean Patent Application No. 10-2020-0155232, filed on Nov. 19, 2020, in the Korean Intellectual Property Office, the disclosures of which are incorporated by reference herein in their entireties.

BACKGROUND

1. Field

The disclosure relates to a display module configured to realize an image using an inorganic light emitting diode (LED), a display apparatus, and a method for manufacturing the same.

2. Description of Related Art

A display apparatus may be classified into a self-luminous display in which each pixel emits light and a non-self-luminous display that requires a separate light source.

A Liquid Crystal Display (LCD) is a typical non-self-luminous display, and needs a backlight unit to supply light from the rear of a display panel, a liquid crystal layer to serve as a switch to transmit or block light, and a color filter to change supplied light to a desired color. Therefore, the LCD tends to be complex in structure and there is a limitation in implementing a small thickness.

On the other hand, the self-luminous display, in which each pixel emits light by itself by including an LED for each pixel, does not need components, such as a backlight unit and a liquid crystal layer, and further omits a color filter. Therefore, the self-luminous display has a simply structure and a high degree of freedom in the design. Further, it is possible to realize a small thickness, better contrast, higher brightness and better viewing angle.

A micro-LED display in the self-luminous display is one of the flat-panel displays and includes a plurality of LEDs having a size of 100 micrometers or less. In comparison with LCD panels that require a backlight, the micro-LED display panels provide better contrast, better response time and higher energy efficiency.

The micro-LED, that is, an inorganic LED, has higher brightness, better light emission efficiency, and longer life in comparison with an organic LED (OLED) that needs a separate encapsulation layer for protecting organic materials.

SUMMARY

Provided are a display module, a display apparatus and a method for manufacturing the display module capable of minimizing IR drop by compensating a voltage by providing a regulator to each of a plurality of micro-pixel controllers arranged in two dimensions, and by transferring the compensated voltage to a micro-pixel controller adjacent thereto.

In accordance with an aspect of the disclosure, there is provided a display module including: a plurality of pixels; a first substrate; a plurality of LEDs arranged on the first substrate, each of the plurality of pixels including two or more inorganic LEDs among the plurality of inorganic LEDs; and a plurality of micro-pixel controllers two-dimensionally arranged in a first direction and a second direction on the first substrate, each of the plurality of micro-pixel controllers being configured to control two or more pixels among the plurality of pixels, wherein each micro-pixel controller of the plurality of micro-pixel controllers is electrically connected to micro-pixel controllers adjacent thereto, and is configured to convert a voltage input from one of the micro-pixel controllers that is electrically connected thereto in a direction opposite to the first direction into a target voltage and supply the target voltage to another micro-pixel controller of the micro-pixel controllers that is electrically connected thereto in the first direction.

Each of the plurality of micro-pixel controllers includes: a second substrate; and at least one thin film transistor (TFT) arranged on the second substrate.

The at least one TFT is configured to switch the plurality of inorganic LEDs forming the two or more pixels, and supply a driving current to the plurality of inorganic LEDs forming the two or more pixels.

Each of the plurality of micro-pixel controllers is further configured to supply the driving current to the plurality of inorganic LEDs forming the two or more pixels based on the target voltage.

The plurality of micro-pixel controllers include: a plurality of first micro-pixel controllers which are aligned in the second direction, and are configured to receive power from a power board and supply the voltage corresponding to the power to some of the plurality of micro-pixel controllers that are adjacent thereto in the first direction, respectively; and a plurality of second micro-pixel controllers configured to respectively receive the voltage from the plurality of first micro-pixel controllers or the micro-pixel controllers adjacent thereto in the direction opposite to the first direction, among the plurality of second micro-pixel controllers.

Each of the plurality of micro-pixel controllers is further configured to convert the input voltage into the target voltage by increasing or decreasing the input voltage.

Each of the plurality of micro-pixel controllers is configured to convert a power voltage input from the one of the micro-pixel controllers into a target power voltage, and supply the target power voltage to the other micro-pixel controller, and wherein the power voltage is included in the input voltage.

Each of the plurality of micro-pixel controllers includes at least one pixel circuit including the at least one TFT to supply a driving current to the plurality of inorganic LEDs forming the two or more pixels, and supply the target power voltage to the at least one pixel circuit.

Each of the plurality of micro-pixel controllers is further configured to convert a reference voltage input from the one of the micro-pixel controllers into a target reference voltage, and supply the target reference voltage to the other micro-pixel controller, and wherein the reference voltage is included in the input voltage.

Each of the plurality of micro-pixel controllers is further configured to supply the target reference voltage to the plurality of inorganic LEDs forming the two or more pixels.

In accordance with an aspect of the disclosure, there is provided a display apparatus including: a plurality of display modules, each of the plurality of display modules including a plurality of pixels arranged in two dimensions; and a frame configured to support the plurality of display modules, wherein each of the plurality of display modules further includes: a first substrate; a plurality of inorganic LEDs arranged on the first substrate, each of the plurality of pixels including two or more inorganic LEDs among the plurality of inorganic LEDs; and a plurality of micro-pixel controllers two-dimensionally arranged in a first direction and a second direction on the first substrate, each of the plurality of micro-pixel controllers being configured to control two or more pixels among the plurality of pixels, wherein each micro-pixel controller of the plurality of micro-pixel controllers is electrically connected to micro-pixel controllers adjacent thereto, and is configured to convert a voltage input from one of the micro-pixel controllers that is electrically connected thereto in a direction opposite to the first direction into a target voltage and supply the target voltage to another micro-pixel controller of the micro-pixel controllers that is electrically connected thereto in the first direction.

Each of the plurality of micro-pixel controllers includes: a second substrate; and at least one TFT arranged on the second substrate, wherein the at least one TFT is configured to switch the plurality of inorganic LEDs forming the two or more pixels, and supply a driving current to the plurality of inorganic LEDs forming the two or more pixels.

Each of the plurality of micro-pixel controllers is further configured to supply the driving current to the plurality of inorganic LEDs forming the two or more pixels based on the target voltage.

The display apparatus further includes a power board configured to supply power to the plurality of display modules, wherein the power board is arranged on a lower side of the frame and electrically connected to the plurality of display modules through an open area of the frame.

The plurality of micro-pixel controllers include: a plurality of first micro-pixel controllers which are aligned in the second direction, and are configured to receive the power from the power board and supply the voltage corresponding to the received power to some of the plurality of micro-pixel controllers that are adjacent thereto in the first direction, respectively; and a plurality of second micro-pixel controllers configured to respectively receive the voltage from the plurality of first micro-pixel controllers or the micro-pixel controllers adjacent thereto in the direction opposite to the first direction, among the plurality of second micro-pixel controllers.

Each of the plurality of micro-pixel controllers is further configured to convert the input voltage into the target voltage by increasing or decreasing the input voltage.

Each of the plurality of micro-pixel controllers is configured to convert a power voltage input from the one of the micro-pixel controllers into a target power voltage, and supply the target power voltage to the other micro-pixel controller.

Each of the plurality of micro-pixel controllers further includes at least one pixel circuit including the at least one TFT to supply the driving current to the plurality of inorganic LEDs forming the two or more pixels, and supply the target power voltage to the at least one pixel circuit.

Each of the plurality of micro-pixel controllers is further configured to convert a reference voltage input from the one of the micro-pixel controllers into a target reference voltage and supply the target reference voltage to the other micro-pixel controller.

Each of the plurality of micro-pixel controllers is further configured to supply the target reference voltage to the plurality of inorganic LEDs forming the two or more pixels.

In accordance with an aspect of the disclosure, there is provided a display module including: a plurality of pixels; a plurality of inorganic LEDs arranged on a substrate, each of the plurality of pixels including two or more inorganic LEDs among the plurality of inorganic LEDs; and a plurality of micro-pixel controllers arranged in a first direction and a second direction on the substrate, each of the plurality of micro-pixel controllers being configured to control a group of pixels among the plurality of pixels that is disposed in an area of each of the plurality of micro-pixel controllers, wherein the plurality of micro-pixel controllers is electrically interconnected so that one micro-pixel controller is electrically connected to one or more micro-pixel controllers adjacent thereto among the plurality of micro-pixel controllers in at least one of the first direction or a direction opposite to the first direction, wherein the plurality of micro-pixel controllers includes: first micro-pixel controllers which are linearly aligned in the second direction, and are configured to receive input voltage corresponding to a first power from a power board and adjust the first power to have a value of a target voltage, second micro-pixel controllers extending away from the first micro-pixel controllers in the first direction, wherein each micro-pixel controller of a first part of the second micro-pixel controllers is electrically connected to a corresponding micro-pixel controller of the first micro-pixel controllers adjacent thereto in the direction opposite to the first direction and a corresponding micro-pixel controller of a second part of the second micro-pixel controllers extending away from the first part of the second micro-pixel controllers in the first direction, and is configured to receive the input voltage, as a second power, corresponding to the adjusted first power and adjust the second power to have the value of the target voltage, and each micro-pixel controller of the second part of the second micro-pixel controllers is electrically connected to a corresponding micro-pixel controller of the first part of the second micro-pixel controllers adjacent thereto in the direction opposite to the first direction and to a corresponding micro-pixel controller of the second part of the second micro-pixel controllers in the first direction, and is configured to receive the input voltage, as a third power, corresponding to the adjusted second power, and adjust the third power to have the value of the target voltage.

Each of the plurality of micro-pixel controllers includes: a regulator configured to adjust the input voltage to have the value of the target voltage, and a pixel controller configured to receive the adjusted input voltage as the target voltage, and supply a driving current to the plurality of inorganic LEDs forming the group of pixels, the driving current corresponding to the adjusted input voltage.

According to one or more embodiments, it is possible to minimize IR drop and to prevent a decrease in luminance and to prevent Mura effects by compensating a voltage by providing a regulator to each of a plurality of micro-pixel controllers arranged in two dimensions, and by transferring the compensated voltage to a micro-pixel controller adjacent thereto.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
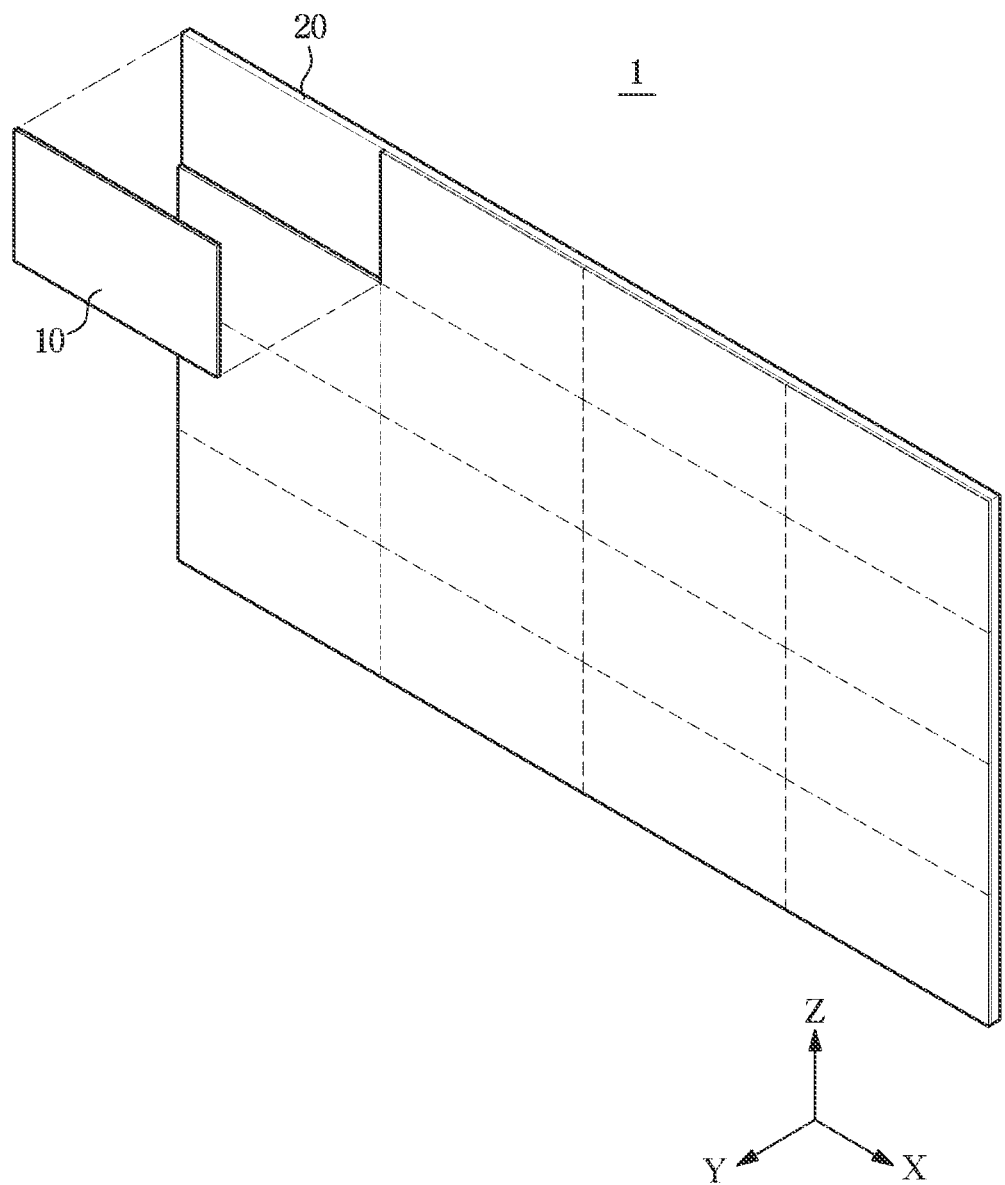
FIG. 1 is a perspective view illustrating an example of a display module, and a display apparatus including the display module according to an embodiment.

Embodiments described herein and configurations shown in the drawings are merely examples of embodiments, and may be modified in various different ways.

It will be understood that when an element is referred to as being "connected" another element, it can be directly or indirectly connected to the other element, wherein the indirect connection includes "connection via a wireless communication network" or "electrical connection through an electrical wiring".

Also, the terms used herein are not limiting. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

As used herein, the terms such as "1st" or "first," "2nd" or "second," etc., may modify corresponding components regardless of importance or order and are used to distinguish one component from another without limiting the components. For example, a first component may be referred to as a second component, and similarly, a second component may also be referred to as a first component.

The term "and/or" includes a plurality of combinations of relevant items or any one item among a plurality of relevant items.

In the following description, terms such as "unit", "part", "block", "member", and "module" indicate a unit for processing at least one function or operation. For example, those terms may refer to at least one process processed by at least one hardware such as Field Programmable Gate Array (FPGA), Application Specific Integrated Circuit (ASIC), at least one software stored in a memory or a processor.

Hereinafter, certain embodiments will be described in detail with reference to the accompanying drawings.

Figure 2:
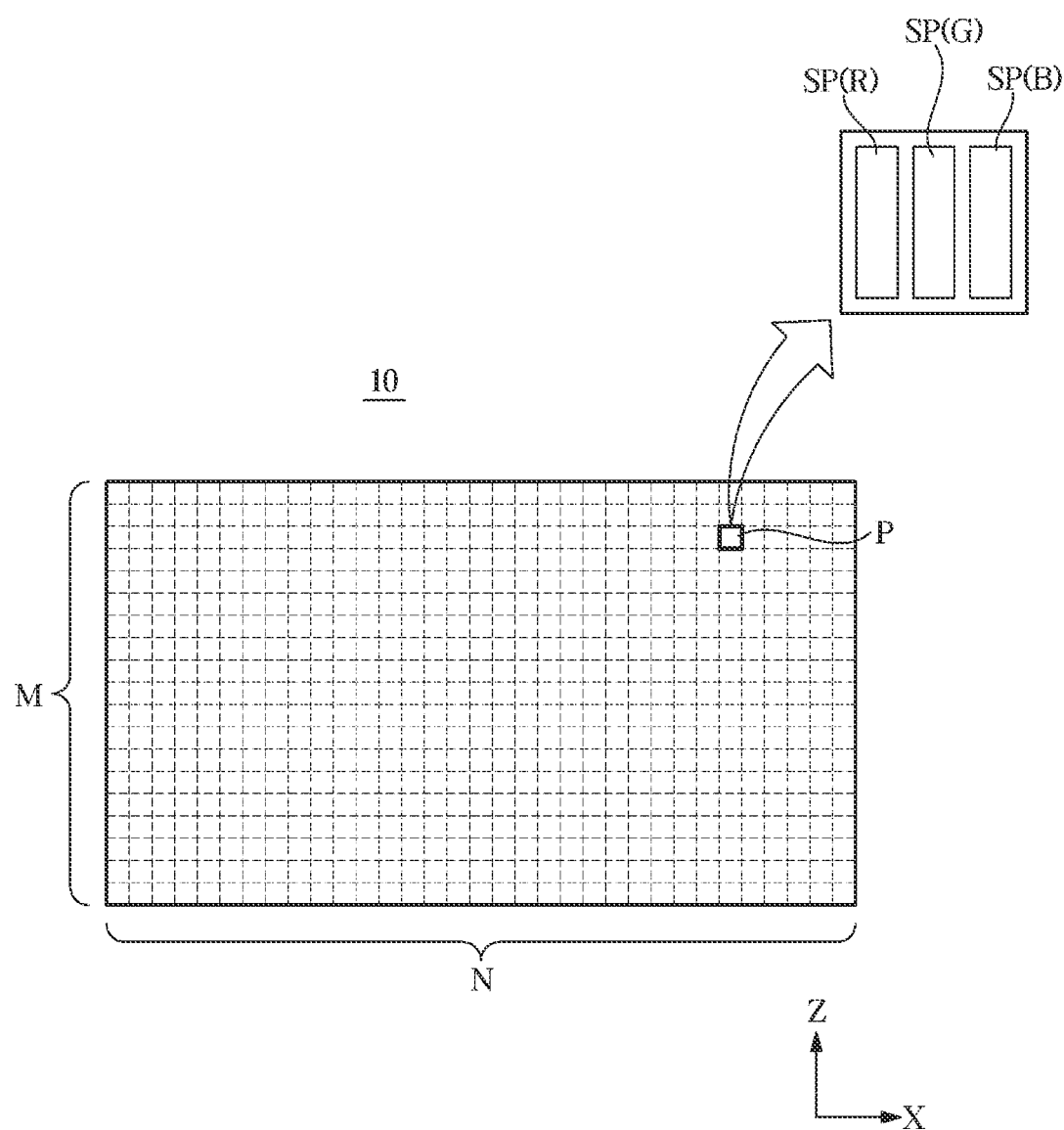
FIG. 2 is a view illustrating an example of a pixel array forming a unit module of the display apparatus according to an embodiment.

FIG. 1 is a perspective view illustrating an example of a display module, and a display apparatus including the display module according to an embodiment, and FIG. 2 is a view illustrating an example of a pixel array forming a unit module of the display apparatus according to an embodiment.

A display apparatus 1 according to an embodiment is a self-luminous display apparatus in which a light emitting element is disposed for each pixel to allow each pixel to emit light by itself. Therefore, because a component, such as a backlight unit and a liquid crystal layer, is not required unlike an LCD apparatus, it is possible to realize a small thickness and a structure of the display apparatus is simple. Therefore, a design may vary in a variety of ways.

In addition, the display apparatus 1 according to an embodiment may include an inorganic light emitting element, such as an LED, as a light emitting element disposed in each pixel. The inorganic light emitting element may have a fast reaction speed and realize higher luminance with lower power in comparison with an organic light emitting element, such as an OLED.

In addition, in comparison with the OLED that requires an encapsulation process because the OLED is vulnerable to exposure to water and oxygen and has poor durability, the inorganic LED does not require the encapsulation process and have better durability. Hereinafter, an inorganic light emitting element illustrated in an embodiment described below represents an inorganic LED.

The inorganic LED of the display apparatus 1 may be a micro-LED having a short side length of about 100 μm. As described above, by employing the micro-unit LED, it is possible to reduce the pixel size and realize higher resolution with the same size screen.

In addition, if a LED chip is manufactured in the size of a micro unit, it is possible to ease a problem in that the LED chip is cracked upon being bent due to characteristics of inorganic materials. That is, in a state in which the micro-LED chip is transferred to a flexible substrate, the LED chip is not broken even if the substrate is bent. Accordingly, it is possible to implement a flexible display apparatus.

A display apparatus including a micro-LED may be applied to various fields due to a small pixel size and a thin thickness. For example, as shown in FIG. 1, a large-size screen may be implemented by tiling a plurality of display modules 10, to which a plurality of micro-LEDs is transferred, and by fixing the plurality of display modules 10 to a housing 20. The display apparatus provided with the large-size screen may be used as a signage, an electric billboard, and the like.

The three-dimensional coordinate system of the X-Y-Z axis shown in FIG. 1 is based on the display apparatus 1, and a plane on which a screen of the display apparatus 1 is positioned is a X-Z plane, and a direction in which an image is output or a direction in which the inorganic LED emits light is the +Y-axis direction. Because the coordinate system is based on the display apparatus 1, the same coordinate system may be applied to both a state in which the display apparatus 1 is placed down and a state in which the display apparatus 1 is upright.

In general, the display apparatus 1 is used in an upright state, and a user views an image from the front of the display apparatus 1. Therefore, the +Y-axis direction in which the image is output is referred to as the front, and the opposite direction may be referred to as the rear.

Further, the display apparatus 1 is typically manufactured in a lying state. Accordingly, the -Y-axis direction of the display apparatus 1 may be referred to as a lower direction, and the +Y-axis direction may be referred to as an upper direction. That is, in an embodiment to be described later, the +Y-axis direction may be referred to as an upper direction or a front direction, and the -Y-axis direction may be referred to as a lower direction or a rear direction.

Except for the upper and lower surfaces of the flat panel display apparatus 1 or the display module 10, the remaining four surfaces may be referred to as side surfaces regardless of the posture of the display apparatus 1 or the display module 10.

In the example of FIG. 1, the display apparatus 1 includes a plurality of display modules to implement a large-size screen, but an embodiment of the display apparatus 1 is not limited thereto. By including a single display module 10, the display apparatus 1 may be implemented as a TV, a wearable device, a portable device, a PC monitor, etc.

Referring to FIG. 2, the display module 10 may include an M×N (M and N are two or more integers) array of pixels. That is, the display module 10 may include a pixel array includes M rows and N columns. In other words, the display module 10 may include a plurality of pixels arranged in two dimensions. FIG. 2 conceptually illustrates a pixel arrangement, and it should be understood that a bezel region or a wiring region, on which an image is not displayed, is located in the display module 10 as well as an active region in which the pixels are arranged.

In an embodiment, that certain components are arranged in two dimensions may include not only a case in which the components are arranged on the same plane, but also include a case in which the components are arranged on different planes parallel to each other. In addition, that the corresponding components are arranged on the same plane may include not only a case in which an upper end of the corresponding components are arranged on the same plane, but also include a case in which an upper end of the corresponding components are arranged on different planes parallel to each other.

The unit pixel P may include at least three sub-pixels that output light of different colors. For example, the unit pixel P may include three sub-pixels SP(R), SP(G), and SP(B) corresponding to R, G, and B colors, respectively. The red sub-pixel SP(R) may output red light, the green sub-pixel SP(G) may output green light, and the blue sub-pixel SP(B) may output blue light.

However, the pixel arrangement of FIG. 2 is only an example applicable to the display module 10 and the display apparatus 1 according to an embodiment. Alternatively, the sub-pixels may be arranged along the Z-axis direction, might not be arranged in a line, and the sub-pixels in the different size may be provided. As long as a single pixel includes a plurality of sub-pixels to implement a plurality of colors, the size or arrangement method of each sub-pixel may vary.

In addition, it is not limiting that the unit pixel P includes the red sub-pixel SP(R) outputting red light, the green sub-pixel SP(G) outputting green light, and the blue sub-pixel SP(B) outputting blue light, and thus the unit pixel P may include, alternatively or additionally, a sub-pixel outputting yellow light and/or a sub-pixel outputting white light. That is, the color or type of light output from each sub-pixel and the number of sub-pixels may vary.

However, in an embodiment to be described later, an example in which the unit pixel P includes a red sub-pixel SP(R), a green sub-pixel SP(G), and a blue sub-pixel SP(B) will be described for a detailed description.

As mentioned above, the display module 10 and the display apparatus 1 according to an embodiment are a self-luminous display apparatus in which each pixel emits light by itself. Accordingly, an inorganic LED emitting light of different colors may be disposed in each sub-pixel. For example, a red inorganic LED may be disposed in the red sub-pixel SP(R), a green inorganic LED may be disposed in the green sub-pixel SP(G), and a blue inorganic LED may be disposed in the blue sub-pixel SP(B).

Accordingly, in an embodiment, the pixel P may represent a cluster including a red inorganic LED, a green inorganic LED, and a blue inorganic LED, and a sub-pixel may represent each inorganic LED.

Figure 3:
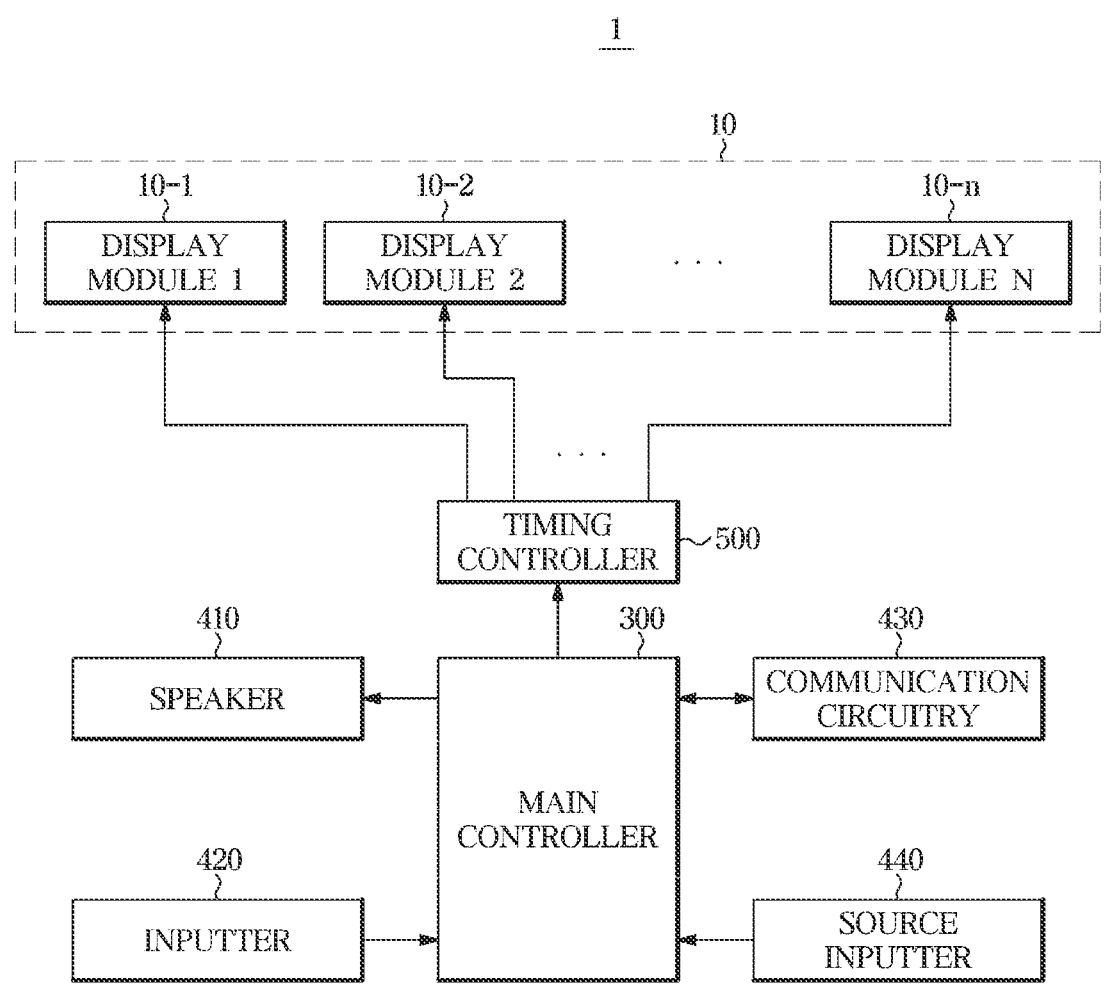
FIG. 3 is a control block diagram of the display apparatus according to an embodiment.

FIG. 3 is a control block diagram of the display apparatus according to an embodiment.

As described above with reference to FIG. 1, the display apparatus 1 according to an embodiment may include a plurality of display modules 10-1 and 10-2 to 10-n. Although three display modules are shown in FIG. 3, a number of the display modules may be 2 or greater. The display apparatus 1 may include a main controller 300 and a timing controller 500 configured to control the plurality of display modules 10, a communication circuitry 430 configured to communicate with an external device, a source inputter 440 configured to receive a source image, a speaker 410 configured to output sound, and an inputter 420 configured to receive a command for controlling the display apparatus 1 from a user.

The inputter 420 may include a button or a touch pad provided in one region of the display apparatus 1, and when a display panel 100 (refer to FIG. 4) is implemented as a touch screen, the inputter 420 may include a touch pad installed on a front surface of the display panel 100. Further, the inputter 420 may include a remote controller.

The inputter 420 may receive various commands for controlling the display apparatus 1, such as power on/off, volume adjustment, channel adjustment, screen adjustment, and various settings change of the display apparatus 1 from the user.

The speaker 410 may be provided in one region of the housing 20, and/or a separate speaker module physically separated from the housing 20 may be provided.

The communication circuitry 430 may communicate with a relay server or other electronic device to exchange data. The communication circuitry 430 may include at least one of wireless communication technologies such as 3rd Generation (3G), 4th Generation (4G), wireless LAN, Wi-Fi, Bluetooth, ZigBee, Wi-Fi Direct (WFD), Ultra-wideband (UWB), Infrared Data Association (IrDA), Bluetooth Low Energy (BLE), near field communication (NFC), and Z-Wave. In addition, the communication circuitry 430 may include a wired communication method such as Peripheral Component Interconnect (PCI), PCI-express, or Universal Serial Bus (USB).

The source inputter 440 may receive a source signal input from a set-top box, USB, antenna, or the like. Accordingly, the source inputter 440 may include at least one selected from a group of source input interfaces including an HDMI cable port, a USB port, and an antenna.

A source signal received by the source inputter 440 may be processed by the main controller 300 and converted into a form that can be output by the display panel 100 and the speaker 410.

The main controller 300 and/or the timing controller 500 may include at least one memory configured to store a program and various data for performing an operation to be described later, and at least one processor configured to execute the stored program.

The main controller 300 may process a source signal input through the source inputter 440 to generate an image signal corresponding to the input source signal.

For example, the main controller 300 may include a source decoder, a scaler, an image enhancer, and a graphics processor. The source decoder may decode a source signal compressed in a format such as MPEG, and the scaler may output image data of a desired resolution through resolution conversion.

The image enhancer may improve the image quality of image data by applying various techniques of correction. The graphics processor may classify pixels of image data into RGB data and output the RGB data together with a control signal such as a syncing signal for display timing in the display panel 100. That is, the main controller 300 may output image data and a control signal corresponding to the source signal.

The above-described operation of the main controller 300 is only an example applicable to the display apparatus 1, and the main controller 300 may further perform other operations or may omit some of the above-described operations.

Image data and control signals output from the main controller 300 may be transmitted to the timing controller 500.

The timing controller 500 may convert the image data transmitted from the main controller 300 into image data in a form that can be processed by a driver IC 200 (refer to FIG. 4), and the timing controller 500 may generate various control signals such as a timing control signal to display the image data on the display panel 100.

It is not limiting that the display apparatus 1 according to an embodiment includes the plurality of display modules 10, but in an embodiment to be described below, an example in which the display apparatus 1 includes the plurality of display modules 10 will be described for detailed description.

Figure 4:
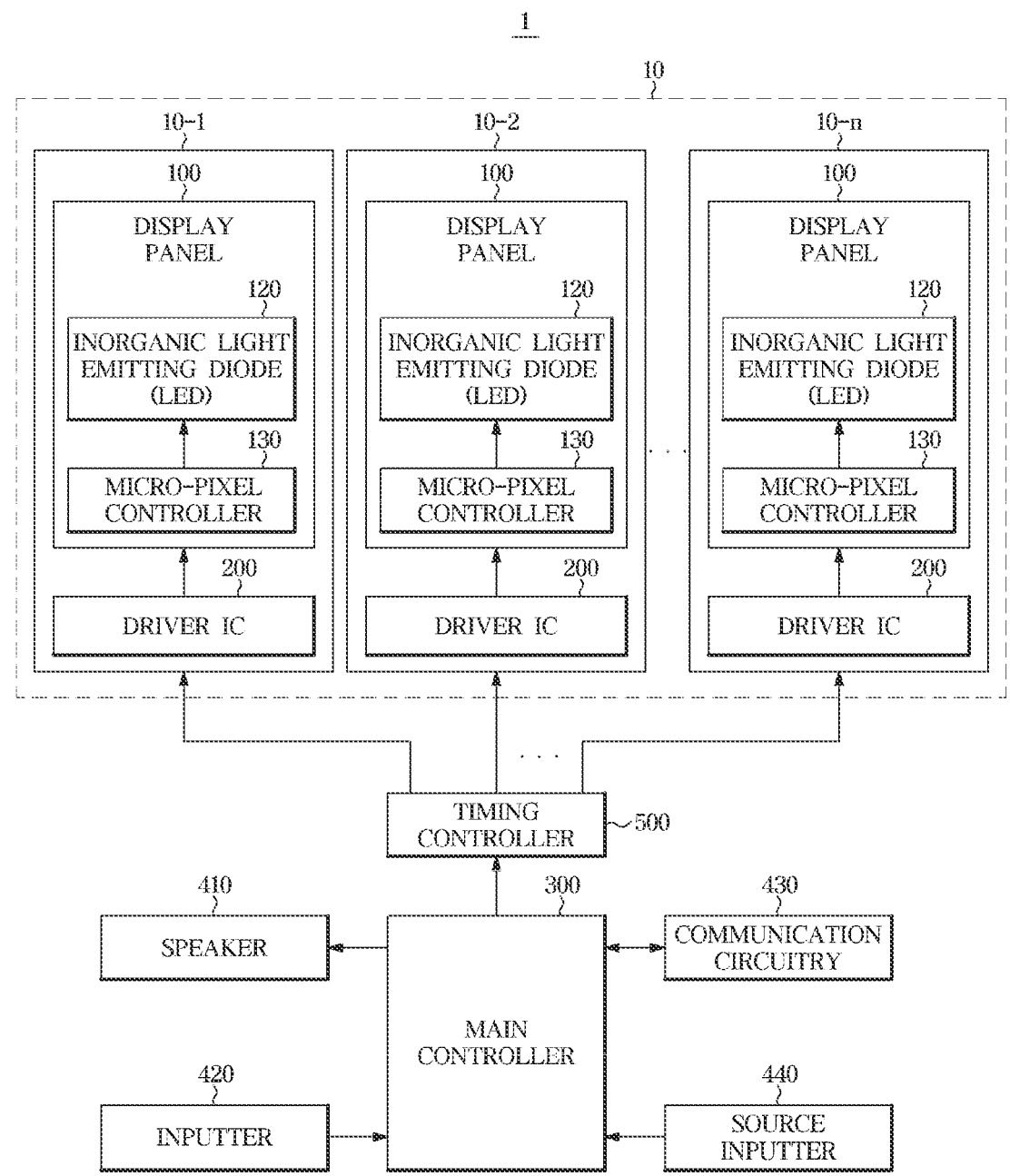
FIG. 4 is a control block diagram illustrating a configuration of the display module contained in the display apparatus according to an embodiment.
Figure 5:
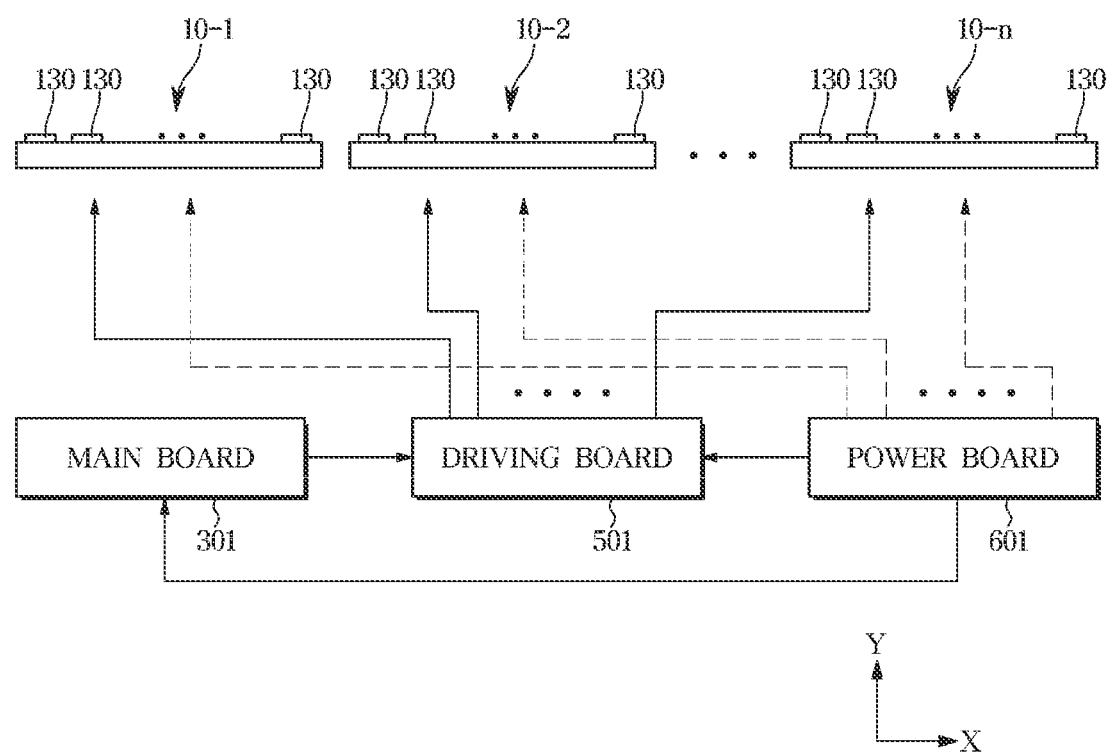
FIG. 5 is a view illustrating an example of a signal transmitted to a plurality of display modules tiled on the display apparatus according to an embodiment.

FIG. 4 is a control block diagram illustrating a configuration of the display module 10 contained in the display apparatus 1 according to an embodiment, and FIG. 5 is a view illustrating an example of a signal transmitted to a plurality of display modules 10 tiled on the display apparatus 1 according to an embodiment.

Referring to FIG. 4, each of the plurality of display modules 10-1 and 10-2 to 10-n may include the display panel 100 configured to display an image, and the driver IC 200 configured to drive the display panel 100.

The display panel 100 may include a plurality of pixels arranged in two dimensions as described above, and each pixel may include a plurality of sub-pixels to implement various colors.

Further, as mentioned above, the display apparatus 1 according to an embodiment is a self-luminous display apparatus in which each pixel emits light by itself. Accordingly, an inorganic LED 120 may be disposed in each sub-pixel. That is, each of the plurality of pixels may include two or more inorganic LEDs 120.

Each of inorganic LED 120 may be driven by an Active Matrix (AM) method or a Passive Matrix (PM) method, but in an embodiment to be described below, an example in which the inorganic LED 120 is driven by the AM method will be described for detailed description.

In the display module 10 according to an embodiment, each inorganic LED 120 may be individually controlled by a micro-pixel controller 130, and the micro-pixel controller 130 may be operated based on a driving signal output from the driver IC 200.

The micro-pixel controller 130 may be arranged in rows and columns on a module substrate of the display module 10, and may be electrically connected to two or more pixels to supply a driving current. For example, each of the plurality of micro-pixel controllers 130 may be electrically connected to the micro-pixel controllers 130 disposed in the same column in a row adjacent thereto.

In an embodiment, the arrangement of certain elements in the same column may include not only a case in which the elements are arranged in a column that is numerically completely identical, but also a case in which elements are arranged in a column that is identical within a certain error range. In addition, in an embodiment, the arrangement of certain elements in the same row may include not only a case in which the elements are arranged in a row that is numerically completely identical, but also a case in which the elements are arranged in a row that is identical within a certain error range.

In other words, the plurality of micro-pixel controllers 130 may be arranged in two dimensions on a module substrate (a first substrate to be described later) of the display module 10, and each of the plurality of micro-pixel controllers 130 may be electrically connected to a micro-pixel controller adjacent thereto in a first direction. The first direction may correspond to an upward column direction, that is, a +Z-axis direction. Alternatively, the first direction may correspond to a downward column direction, that is, a −Z-axis direction or a direction extending along the rows, that is a +X-axis direction or a −X-axis direction.

Referring to FIG. 5, the plurality of display modules 10-1 and 10-2 to 10-n may be electrically connected to a driving board 501. For example, the display panel 100 may be connected to a Field Programmable Circuit Board (FPCB) through a film on which the driver IC 200 is mounted. The FPCB may be connected to the driving board 501 to electrically connect the display module 10 to the driving board 501.

The timing controller 500 may be provided on the driving board 501. Accordingly, the driving board 501 may be referred to as a timing controller (T-con) board. The plurality of display modules 10-1 and 10-2 to 10-n may receive image data, and a timing control signal from the driving board 501.

The display apparatus 1 may further include a main board 301 and a power board 601. The above-described main controller 300 may be provided on the main board 301, and a power supply circuit configured to supply power to the plurality of display modules 10-1 and 10-2 to 10-n may be provided on the power board 601.

The power board 601 may be electrically connected to the plurality of display modules 10-1 and 10-2 to 10-n through the FPCB, and the power board 601 may supply the power voltage $V_{DD}$, and the reference voltage $V_{SS}$ to the plurality of display modules 10-1 and 10-2 to 10-n connected through the FPCB.

For example, the power voltage $V_{DD}$ and the reference voltage $V_{SS}$ supplied from the power board 601 may be applied to the micro-pixel controller 130 disposed on the module substrate through a wiring of the module substrate. Particularly, the power voltage $V_{DD}$ and the reference voltage $V_{SS}$ supplied from the power board 601 may be applied to the micro-pixel controller 130 arranged on a first row.

For example, a micro-pixel controller 130 arranged in a row other than the first row may receive a voltage from a micro-pixel controller 130 in the previous row, and convert the input voltage into a target voltage so as to transfer the target voltage to a micro-pixel controller 130 in the next row.

Particularly, each of the plurality of micro-pixel controllers 130 may be electrically connected to the micro-pixel controller adjacent thereto in the column direction, and convert a voltage, which is input from one of the micro-pixel controllers electrically connected thereto, into a target voltage, and then transfer the target voltage to another micro-pixel controller of the micro-pixel controllers electrically connected thereto.

Accordingly, the display module 10 may allow the plurality of micro-pixel controllers 130 to be driven with the same target voltage regardless of the distance from the power board 601, so as to prevent IR drop that may occur according to the distance from the power board 601. The transfer of the voltage between the micro-pixel controllers 130 will be described in detail later.

In the above example, it has been described that the plurality of display modules 10-1 and 10-2 to 10-n share the driving board 501 and the power board 601, but a separate driving board 501 and a separate power board 601 may be connected to each display module 10. Alternatively, it is also possible to group the plurality of display modules 10-1 and 10-2 to 10-n and connect one driving board 501 and one power board 601 to each group of display modules.

FIG. 5 is a view illustrating the display apparatus 1 on the X-Y plane, particularly, arranging the display modules 10-1 and 10-2 to 10-n in one-dimension. However, it is possible to arrange the plurality of display modules 10-1 and 10-2 to 10-n in two dimensions as described with reference to FIG. 1.

Figure 6:
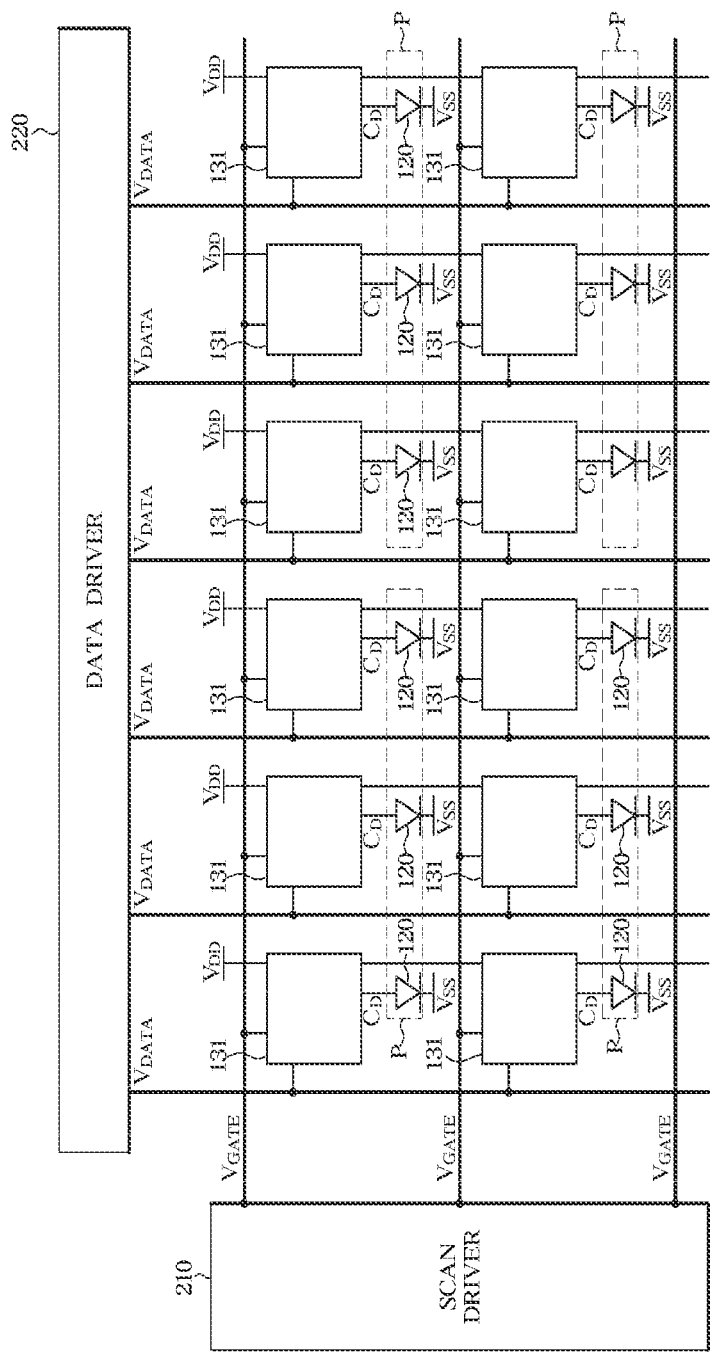
FIG. 6 is a view schematically illustrating a manner in which each pixel is driven in the display module according to an embodiment.
Figure 7:
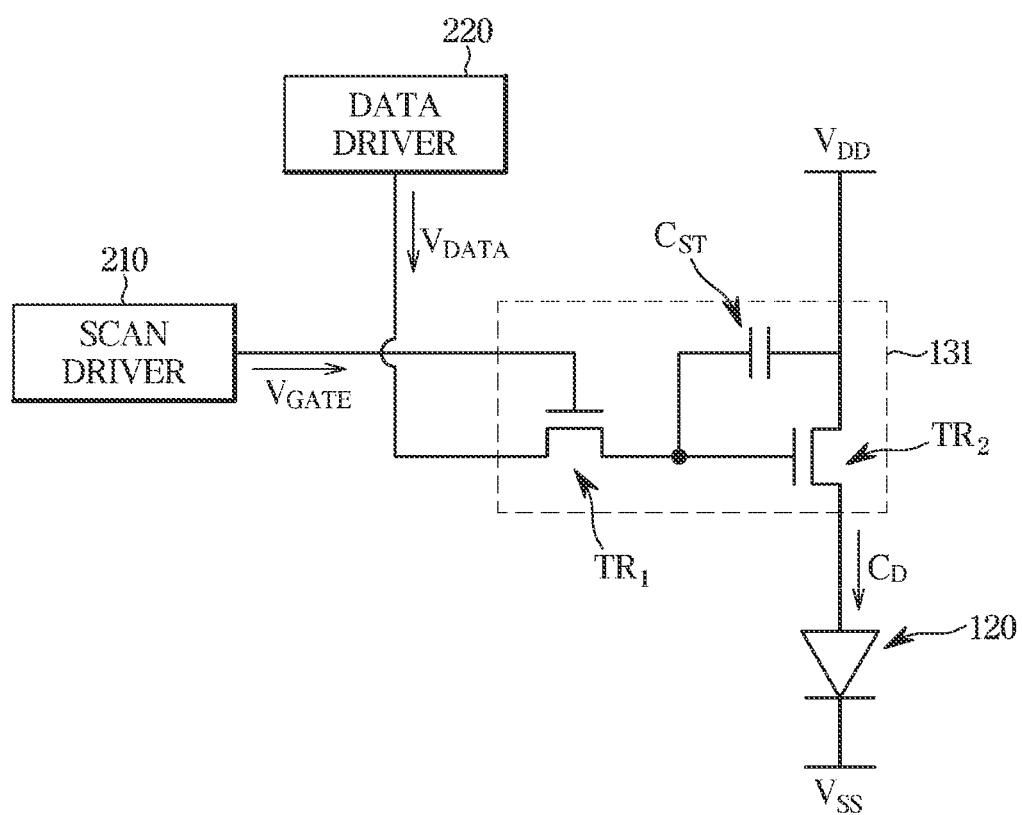
FIG. 7 is a circuit diagram schematically illustrating a pixel circuit controlling a single sub-pixel in the display module according to an embodiment.
Figure 8:
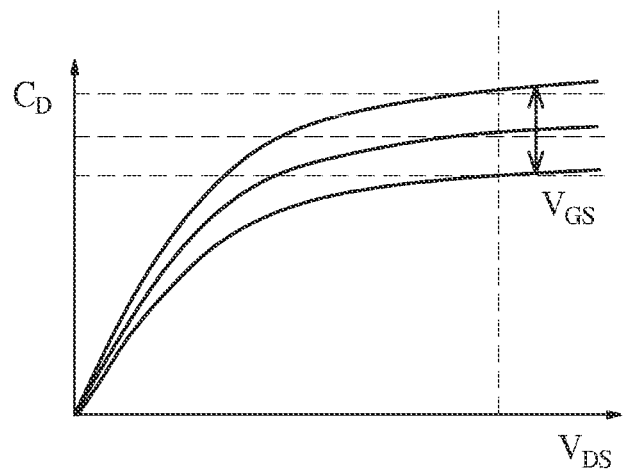
FIGS. 8 and 9 are views illustrating a change in a driving current according to a power voltage or a reference voltage in the pixel circuit according to an embodiment.
Figure 9:
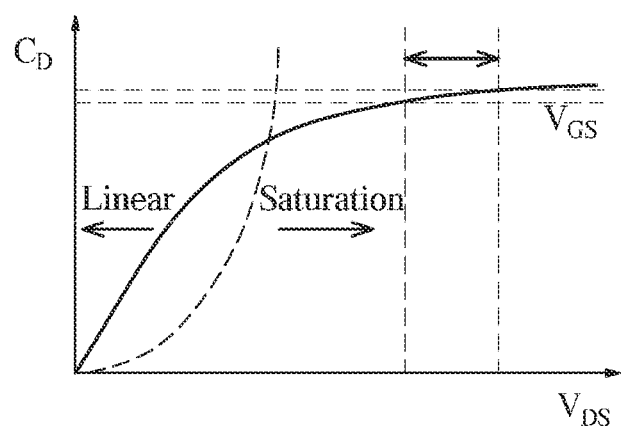

FIG. 6 is a view schematically illustrating a manner in which each pixel is driven in the display module 10 according to an embodiment, FIG. 7 is a circuit diagram schematically illustrating a pixel circuit controlling a single sub-pixel in the display module 10 according to an embodiment, and FIGS. 8 and 9 are views illustrating a change in a driving current according to a power voltage or a reference voltage in the pixel circuit according to an embodiment.

Referring to FIG. 6, the driver IC 200 may include a scan driver 210 and a data driver 220. The scan driver 210 may output a gate signal configured to turn on/off the sub-pixel, and the data driver 220 may output a data signal configured to realize an image. However, according to various design changes, some of the operations of the driver IC 200 may be performed by the micro-pixel controller 130. For example, the operation of the scan driver 210 may be performed by the micro-pixel controller 130. In this case, the driver IC 200 does not include the scan driver 210. In an embodiment to be described below, a case in which the driver IC 200 includes both the scan driver 210 and the data driver 220 will be described as an example for a detailed description.

The scan driver 210 may generate a gate signal based on a control signal transmitted from the timing controller 500, and the data driver 220 may generate a data signal based on image data transmitted from the timing controller 500.

The micro-pixel controller 130 may include a pixel circuit 131 configured to individually control each inorganic LED 120, and a gate signal output from the scan driver 210 and a data signal output from the data driver 220 may be input to the pixel circuit 131.

For example, in response to that a gate voltage $V_{GATE}$, a data voltage $V_{DATA}$, and a power voltage $V_{DD}$ are input to the pixel circuit 131, the pixel circuit 131 may output a driving current $C_D$ for driving the inorganic LED 120.

The driving current $C_D$ output from the pixel circuit 131 may be input to the inorganic LED 120, and the inorganic LED 120 may emit light by the input driving current $C_D$ so as to implement an image.

Meanwhile, as described above, according to an embodiment, each of the micro-pixel controllers 130 may be electrically connected to the timing controller 500 to receive a gate signal, and process the transferred gate signal so as to control the pixel circuit 131, thereby outputting the driving current $C_D$. For example, the scan driver 210 may be omitted.

Referring to an example of FIG. 7, the pixel circuit 131 may include a switching transistor $TR_1$ and a driving transistor $TR_2$ which are thin film transistors and a capacitor $C_{st}$ configured to switch or drive the inorganic LED 120. As described above, the inorganic LED 120 may be a micro-LED.

For example, the switching transistor $TR_1$ and the driving transistor $TR_2$ may be implemented as PMOS type transistors. However, embodiments of the display module 10 and the display apparatus 1 are not limited thereto, and the switching transistor $TR_1$ and the driving transistor $TR_2$ may be implemented as NMOS type transistors.

A gate electrode of the switching transistor $TR_1$ is connected to the scan driver 210, a source electrode thereof is connected to the data driver 220, and a drain electrode thereof is connected to one end of the capacitor $C_{st}$ and the gate electrode of the driving transistor $TR_2$. The power voltage $V_{DD}$ may be applied to the other end of the capacitor $C_{st}$.

In addition, the power voltage $V_{DD}$ may be supplied to a source electrode of the driving transistor $TR_2$, and a drain electrode thereof is connected to an anode of the inorganic LED 120. The reference voltage $V_{SS}$ may be supplied to a cathode of the inorganic LED 120. The reference voltage $V_{SS}$ is a voltage of a lower level than the power voltage $V_{DD}$, and a ground voltage or the like may be used as the reference voltage so as to provide a ground.

The pixel circuit 131 having the above-described structure may operate as follows. First, in response to that the switching transistor $TR_1$ is turned on by applying the gate voltage $V_{GATE}$ from the scan driver 210, the data voltage $V_{DATA}$ applied from the data driver 220 may be transmitted to one end of the capacitor $C_{st}$ and the gate electrode of the driving transistor $TR_2$.

A voltage corresponding to a gate-source voltage $V_{GS}$ of the driving transistor $TR_2$ may be maintained for a predetermined time by the capacitor $C_{st}$. The driving transistor $TR_2$ may apply a driving current $C_D$ corresponding to the gate-source voltage $V_{GS}$ to the anode of the inorganic LED 120 so as to allow the inorganic LED 120 to emit light.

In response to a transmission of a high data voltage $V_{DATA}$ to the gate electrode of the driving transistor $TR_2$, the gate-source voltage $V_{GS}$ of the driving transistor $TR_2$ may be reduced and a small amount of the driving current $C_D$ may be applied to the inorganic LED 120 and thus the inorganic LED 120 may display a low level of grayscale.

On the other hand, in response to a transmission of a low data voltage $V_{DATA}$, the gate-source voltage $V_{GS}$ of the driving transistor $TR_2$ may be increased and a large amount of driving current $C_D$ is applied to the inorganic LED 120 and the inorganic LED 120 may display a high level of grayscale.

However, the above-described structure of the pixel circuit 131 is only an example applicable to the display module 10 according to an embodiment, and thus in addition to the above-described example, various circuit structures for switching and driving the plurality of inorganic LEDs 120 may be applicable.

In addition, in an embodiment, a method of controlling the brightness of the inorganic LED 120 may vary. The brightness of the inorganic LED 120 may be controlled by one of various methods, such as a pulse amplitude modulation (PAM) method, a pulse width modulation (PWM) method, and a hybrid method combining the PAM method and the PWM method.

For example, as shown in FIG. 8, in response to that the power voltage $V_{DD}$ applied to the pixel circuit 131 of the micro-pixel controller 130 is changed, the gate-source voltage $V_{GS}$ of the driving transistor $TR_2$ may be changed, and thus the driving current $C_D$ supplied to the inorganic LED 120 may be changed.

Further, as shown in FIG. 9, in response to that the power voltage $V_{DD}$ applied to the pixel circuit 131 of the micro-pixel controller 130 or the reference voltage $V_{SS}$ applied to the inorganic LED 120 is changed, the drain-source voltage VDS of the driving transistor $TR_2$ may be changed and thus the driving current $C_D$ supplied to the inorganic LED 120 may be changed even in a saturation region.

Accordingly, when the power voltage $V_{DD}$ and the reference voltage $V_{SS}$ applied to the micro-pixel controller 130 and the inorganic LED 120 are changed, the driving current $C_D$ corresponding to the input data voltage $V_{DATA}$ is not supplied to the inorganic LED 120 and thus the required luminance is not provided. Accordingly, Mura-effects or color conversion may occur.

Based on that each of the micro-pixel controller 130 and the inorganic LED 120 is electrically connected to the power board 601 to receive the power voltage $V_{DD}$ and the reference voltage $V_{SS}$, a magnitude of the supplied power voltage $V_{DD}$ and reference voltage $V_{SS}$ may be changed according to a difference in a wiring length.

For example, the wiring may be longer as the micro-pixel controller 130 is further away from the power board 601, and the magnitude of the supplied power voltage $V_{DD}$ may be reduced due to IR drop caused by the self-resistance of the wiring. Accordingly, as the distance from the power board 601 is increased, the luminance of the pixel controlled by the micro-pixel controller 130 may be reduced.

Accordingly, in the display apparatus 1 according an embodiment, in order to allow the power voltage $V_{DD}$ and the reference voltage $V_{SS}$ supplied to each of the plurality of micro-pixel controllers 130 disposed in the display module 10 to be the same, a regulator may be provided in the micro-pixel controller 130, and the regulator may convert a voltage input from a micro-pixel controller 130 in the previous row into a target voltage and transfer the target voltage to a micro-pixel controller 130 in the next row.

Hereinafter, a case, in which a voltage of the same magnitude is supplied to each of the plurality of micro-pixel controllers 130 arranged in the display module 10, will be described in more detail.

Figure 10:
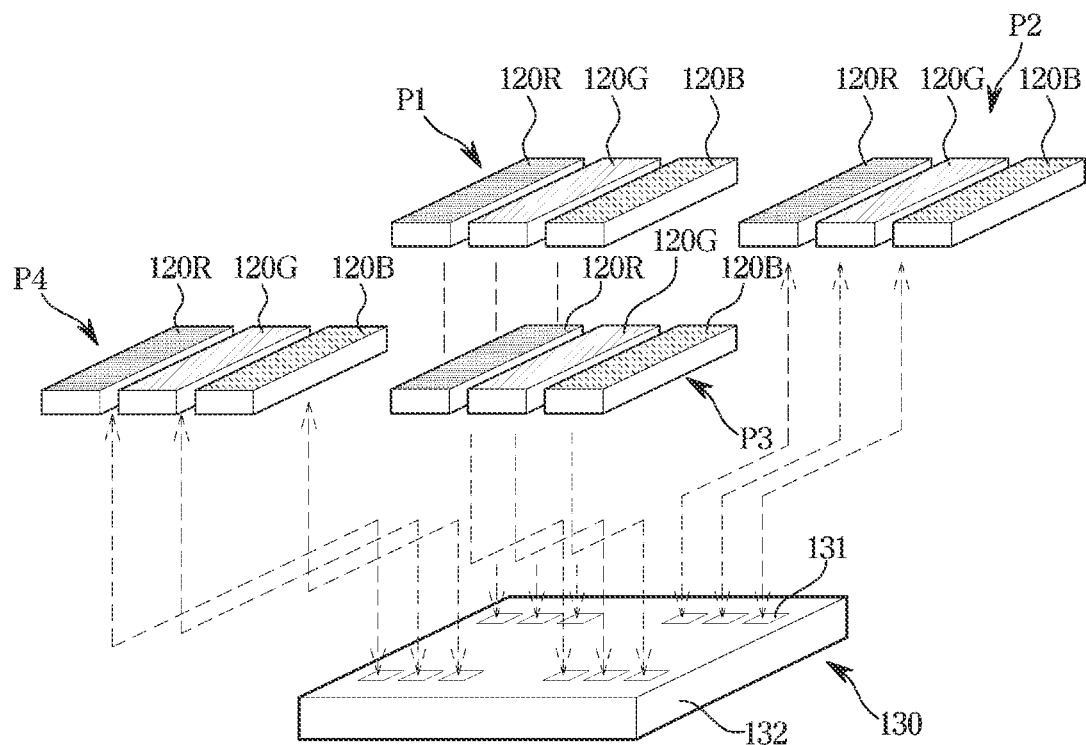
FIG. 10 is a view schematically illustrating a relationship between a micro-pixel controller and a pixel controlled by the micro-pixel controller in the display module according to an embodiment.
Figure 11:
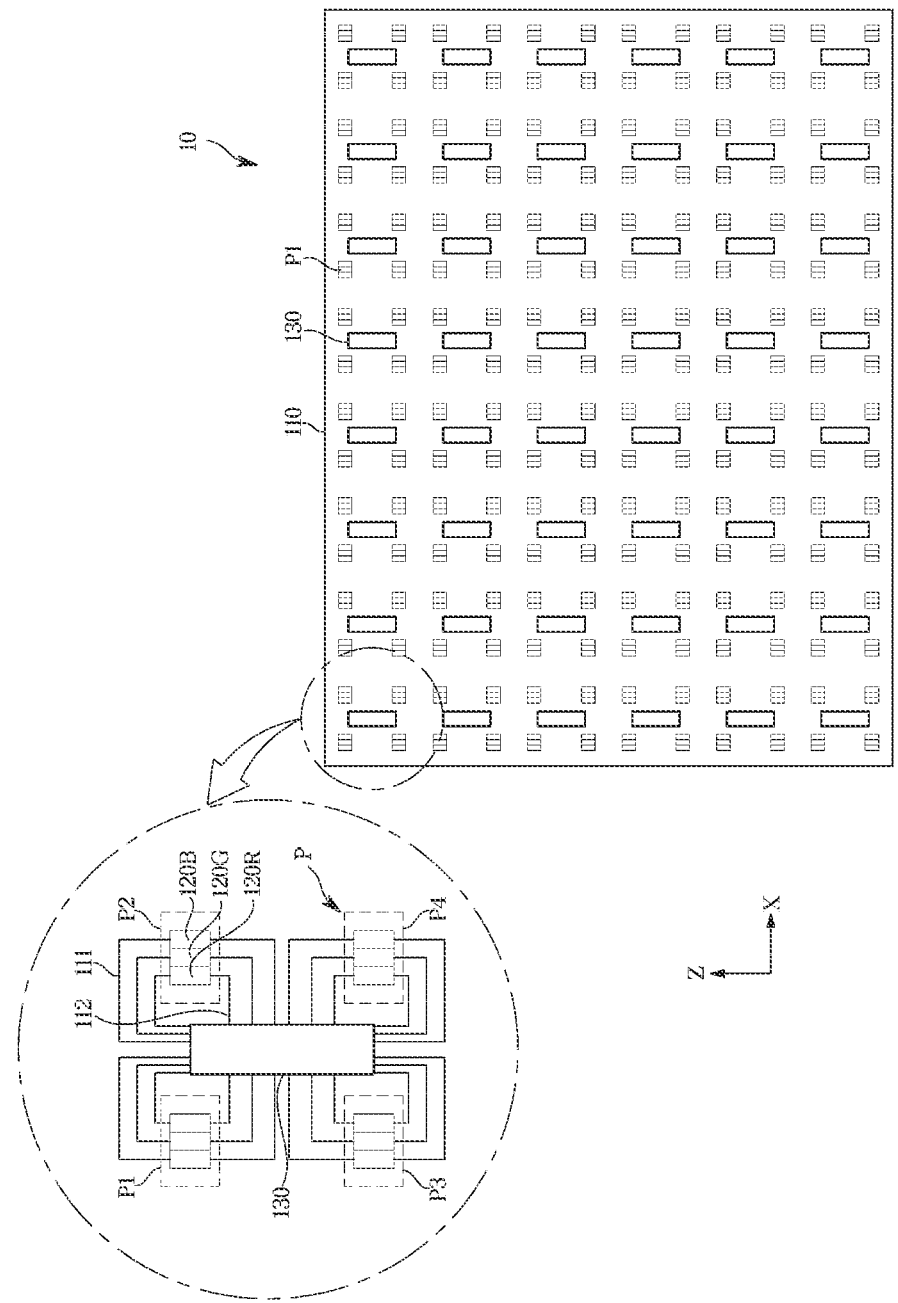
FIG. 11 is a view illustrating an example of an arrangement of the micro-pixel controller and an inorganic LED forming the display module according to an embodiment.
Figure 12:
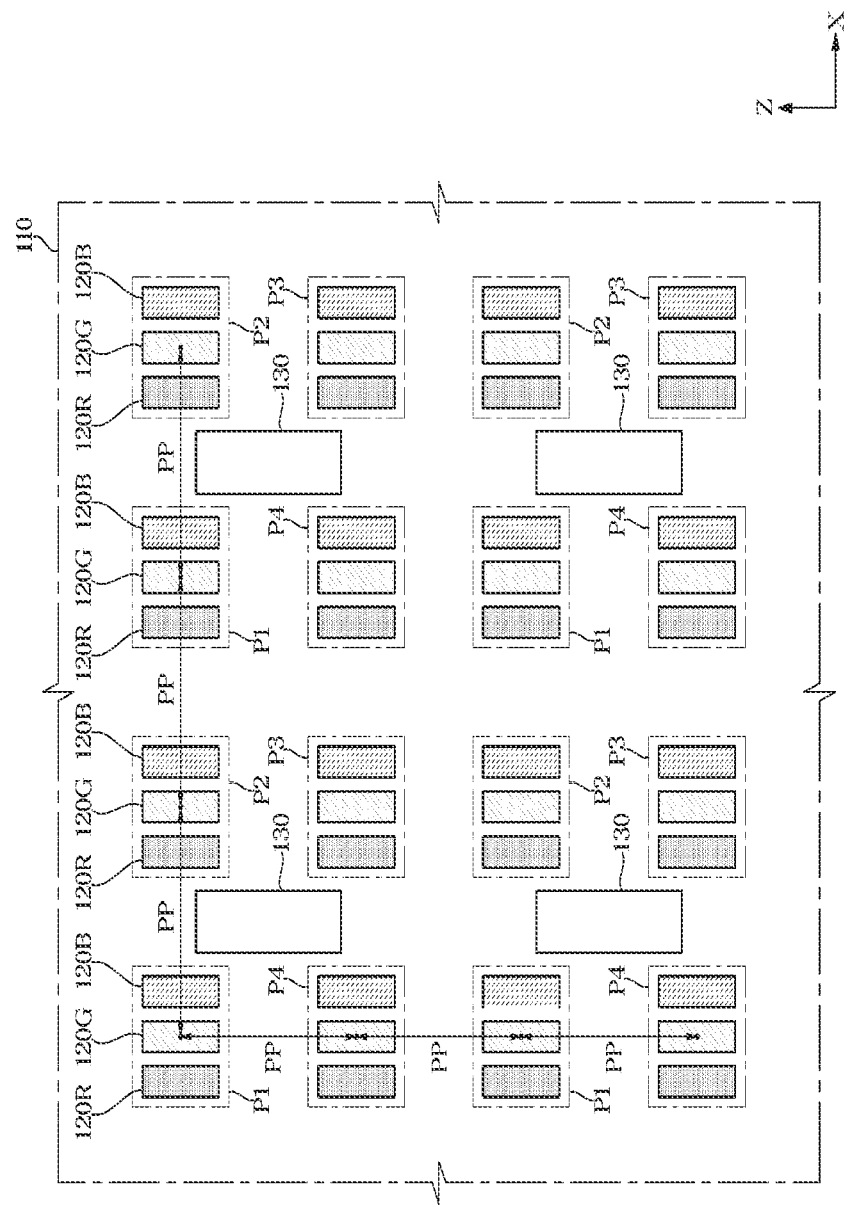
FIG. 12 is a view illustrating an upper surface of a portion of the display module according to an embodiment.

FIG. 10 is a view schematically illustrating an arrangement relationship between the micro-pixel controller 130 and the pixels in the display module 10 according to an embodiment, FIG. 11 is a view illustrating an example of an arrangement of the micro-pixel controller 130 and the inorganic LED 120 forming the display module 10 according to an embodiment, and FIG. 12 is a view illustrating an upper surface of a portion of the display module 10 according to an embodiment.

Referring to FIG. 10, a single micro-pixel controller 130 may control four pixels P1, P2, P3, and P4. Controlling the pixel may mean controlling the plurality of inorganic LEDs 120 forming the pixel. For this, the plurality of pixel circuits 131 configured to control the inorganic LEDs 120 forming the four pixels P1, P2, P3, and P4 may be provided on a second substrate 132 of the micro-pixel controller 130. For example, the pixel circuit 131 may include at least one thin film transistor configured to switch the plurality of inorganic LEDs 120 forming the pixel and configured to supply the driving current $C_D$ to the plurality of inorganic LEDs 120 forming the pixel.

In other words, the micro-pixel controller 130 may include at least one thin film transistor arranged on the second substrate 132, and configured to switch the plurality of inorganic LEDs 120 forming two or more pixels and configured to supply the driving current $C_D$ to the plurality of inorganic LEDs 120 forming two or more pixels.

However, there is no limitation to the number of pixels controlled by a single micro-pixel controller 130. Hereinafter, for convenience of description, a case in which one micro-pixel controller 130 is configured to control four pixels P1, P2, P3, and P4, will be described. For example, one micro-pixel controller 130 may control pixels arranged in a 2×n array or n×2 array (n is an integer greater than or equal to 1). Hereinafter, a case in which one micro-pixel controller 130 is configured to control four pixels P1, P2, P3, and P4 arranged in a 2×2 array, will be described as an example.

It is also possible to provide as many pixel circuits 131 as the number of inorganic LEDs 120 controlled by the micro-pixel controller 130, and it is possible to implement such that a single pixel circuit 131 controls two or more inorganic LEDs 120.

The second substrate 132 may be a silicon substrate, a glass substrate, or a plastic substrate. Because a heat source such as an inorganic LED is not provided in the micro-pixel controller 130, it is possible to select the type of substrate without limitation that is according to the heat resistance of the material.

A thin film transistor formed on the second substrate 132 may be a low temperature polycrystalline silicon (LTPS) thin film transistor or an oxide thin film transistor. The thin film transistor may be an a-Si thin film transistor or a single crystal thin film transistor. However, in an embodiment, a case in which the thin film transistor is an LTPS thin film transistor will be described as an example for detailed description.

As mentioned above, the second substrate 132 may be implemented as a silicon substrate. The silicon substrate has no restrictions on electron mobility compared to the glass substrate, and thus the performance of the LTPS thin film transistor may be improved when the second substrate 132 is implemented as a silicon substrate.

On the other hand, according to an embodiment of the display module 10, it is possible individually perform a circuit inspection for each micro-pixel controller 130, and thus it is possible to mount only the micro-pixel controller 130, which is determined to be a good product by the circuit inspection, to the display module 10. Therefore, in comparison with a case in which the thin film transistor circuit is directly mounted on a module substrate (a first substrate to be described later), it is possible to facilitate the circuit inspection and the replacement of defective products.

Referring to FIG. 11, pixels P may be arranged in rows and columns on the first substrate 110 corresponding to the module substrate of the display module 10. As described above, the pixels P may be disposed in a two-dimensional (2D) array including M rows and N columns on the upper surface of the first substrate 110.

For example, the micro-pixel controller 130 may also be arranged in rows and columns on the first substrate 110. That is, the micro-pixel controller 130 may be disposed in a 2D array including A rows and B columns on the first substrate 110.

For example, as shown in FIG. 11, the micro-pixel controller 130 is disposed on the upper surface of the first substrate 110 to be arranged in a center in a space between the pixels P1, P2, P3, and P4 corresponding to a control target. For example, the micro-pixel controller 130 may be electrically connected to an anode of each pixel P, which corresponds to a control target, through an anode wiring 111, and the micro-pixel controller 130 may be electrically connected to a cathode of each of pixel P, which corresponds to a control target, through a cathode wiring 112.

An electrical connection between the two components according to an embodiment may include not only a case in which conductive materials, through which electricity passes, are directly soldered, but also a case in which two components are connected through separate wirings or a case in which two components are connected using a conductive adhesive. As long as a current flows between the two components, the specific connection method may vary.

Alternatively, depending on embodiments, the micro-pixel controller 130 is not disposed in the center of the space between the pixels P1, P2, P3, and P4, but a position of the micro-pixel controller 130 may vary as long as the micro-pixel controller 130 is electrically connected to the pixels P that is arranged in rows and columns and corresponds to the control target. For example, the micro-pixel controller 130 may be disposed at positions corresponding to a pixel region of the four pixels P1, P2, P3, and P4 that is controlled by the micro-pixel controller 130. According to embodiments, a pixel region represents a region in which each pixel is placed. Particularly, when it is assumed that an active region of the display panel 100 is divided as an M×N array that is the same as the pixel array, a region, in which each pixel is contained, may be defined as a pixel region of the corresponding pixel. More particularly, the micro-pixel controller 130 may be arranged in a portion of a region that is obtained by combining all pixel region of four pixels P1, P2, P3 and P4 that is controlled by the micro-pixel controller 130. That is, the micro-pixel controller 130 may be arranged in an entire pixel region PW. The micro-pixel controller 130 may be arranged at a position corresponding to a center of the entire pixel region PW.

According to embodiments, the micro-pixel controller 130 may be disposed on a lower surface instead of the upper surface of the first substrate 110. For example, the micro-pixel controller 130 may be electrically connected to the pixels P, which correspond to the control target, through a via hole wiring. Hereinafter, for convenience of description, an example in which the micro-pixel controller 130 is disposed on the upper surface of the first substrate 110 will be described.

According to an embodiment of the display module 10, circuit elements such as thin film transistors configured to switch and drive the plurality of inorganic LEDs 120 are provided in a separate micro-pixel controller 130 instead of the first substrate 110. Therefore, it is possible to reduce a plurality of metal wirings that is required to mount circuit elements on the first substrate 110, and accordingly, IR drop due to interference between the plurality of metal wirings may be prevented. In other words, the display module 10 according to an embodiment may reduce wirings on the first substrate 110 compared to a case in which circuit elements are directly mounted on the first substrate 110. Therefore, IR drop due to interference between the wirings may be prevented.

FIG. 12 is an enlarged view illustrating a portion of the upper surface of the display panel 100, and particularly, illustrating that four micro-pixel controllers 130 are arranged adjacent to one another and arranged on the upper surface of the first substrate 110 of the display panel 100.

An interval between pixels adjacent to each other among a plurality of pixels included in the display panel 100 may all be the same. In an embodiment, that certain values are the same may include not only a case in which the corresponding values are completely identical, but also include a case in which the values are identical within a certain error range.

Particularly, as shown in FIG. 12, the pixel interval between pixels adjacent to each other among the pixels P1, P2, P3, and P4 controlled by one micro-pixel controller 130 may be the same. For example, an interval between a first pixel P1 and a second pixel P2 among the pixels P1, P2, P3, and P4 disposed on an upper surface of the micro-pixel controller 130 may be the same as an interval between the first pixel P1 and a fourth pixel P4 disposed on the side of the micro-pixel controller 130.

In addition, as for pixels corresponding to a control target of different micro-pixel controllers 130, a pixel interval between adjacent pixels is the same.

As shown in FIG. 12, a pixel interval between the second pixel P2 controlled by one micro-pixel controller 130 and the first pixel P1 controlled by another micro-pixel controller 130 adjacent to the one micro-pixel controller 130 may be the same as a pixel interval between P1, P2, P3, and P4 controlled by the one micro-pixel controller 130.

Further, as shown in FIG. 12, a pixel interval between the fourth pixel P4 controlled by one micro-pixel controller 130 and the first pixel P1 controlled by another micro-pixel controller 130 adjacent to the one micro-pixel controller 130 may be the same as a pixel interval between P1, P2, P3, and P4 controlled by the one micro-pixel controller 130.

The pixel interval may be referred to as a pixel pitch PP, and in an embodiment, the pixel pitch PP is defined as a distance from the center of one pixel to the center of a pixel adjacent thereto. However, an embodiment of the display module 10 is not limited thereto, and thus another definition for the pixel pitch PP may be applied.

Hereinbefore, the arrangement relationship between the inorganic LED 120, the micro-pixel controller 130 and the first substrate 110 has been described. Hereinafter, a case in which a voltage supplied to the micro-pixel controller 130 is controlled to be the same will be described in more detail.

Figure 13:
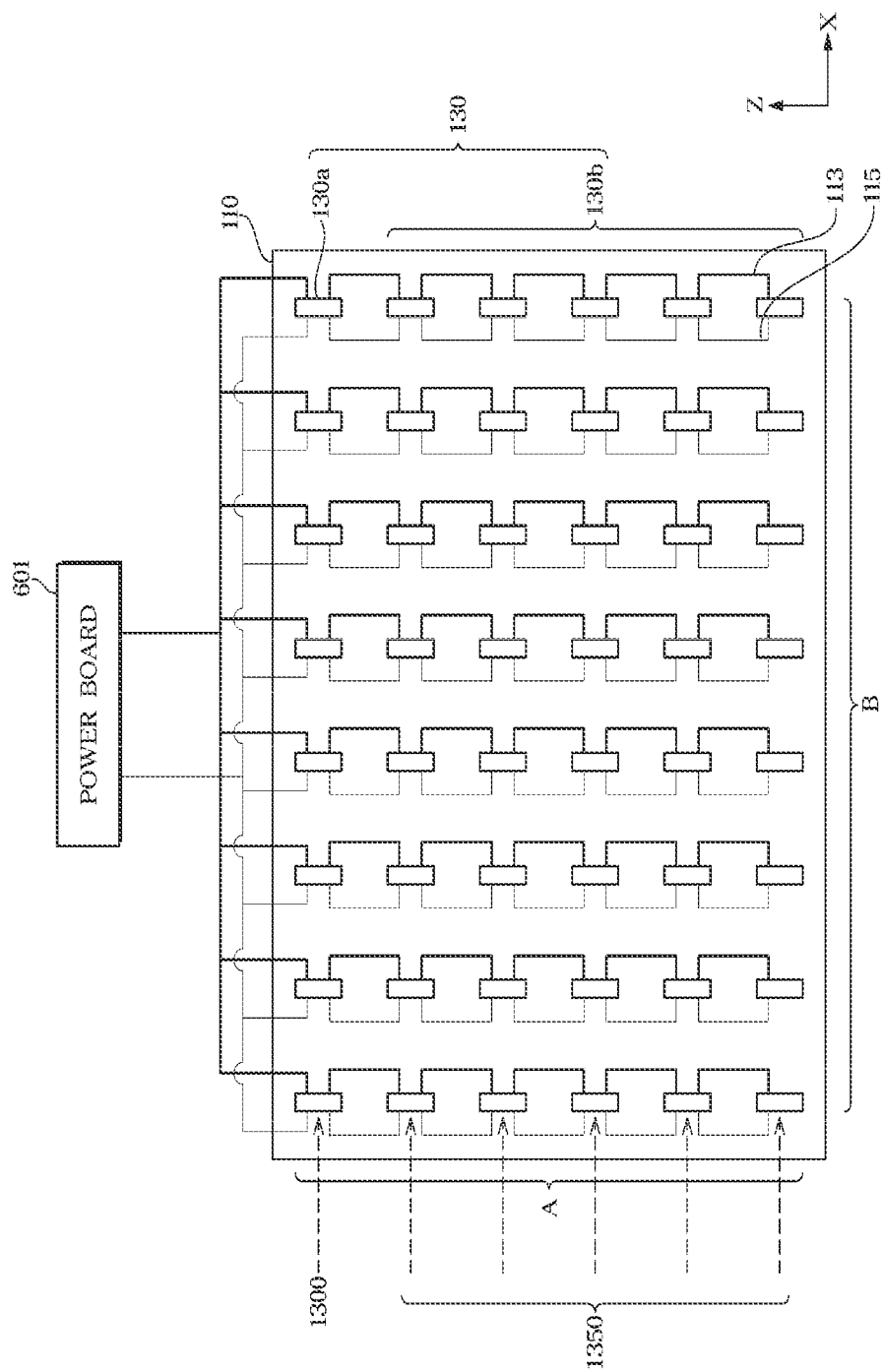
FIGS. 13 and 14 are views schematically illustrating an electrical connection relationship between the micro-pixel controllers in the display module according to an embodiment.
Figure 14:
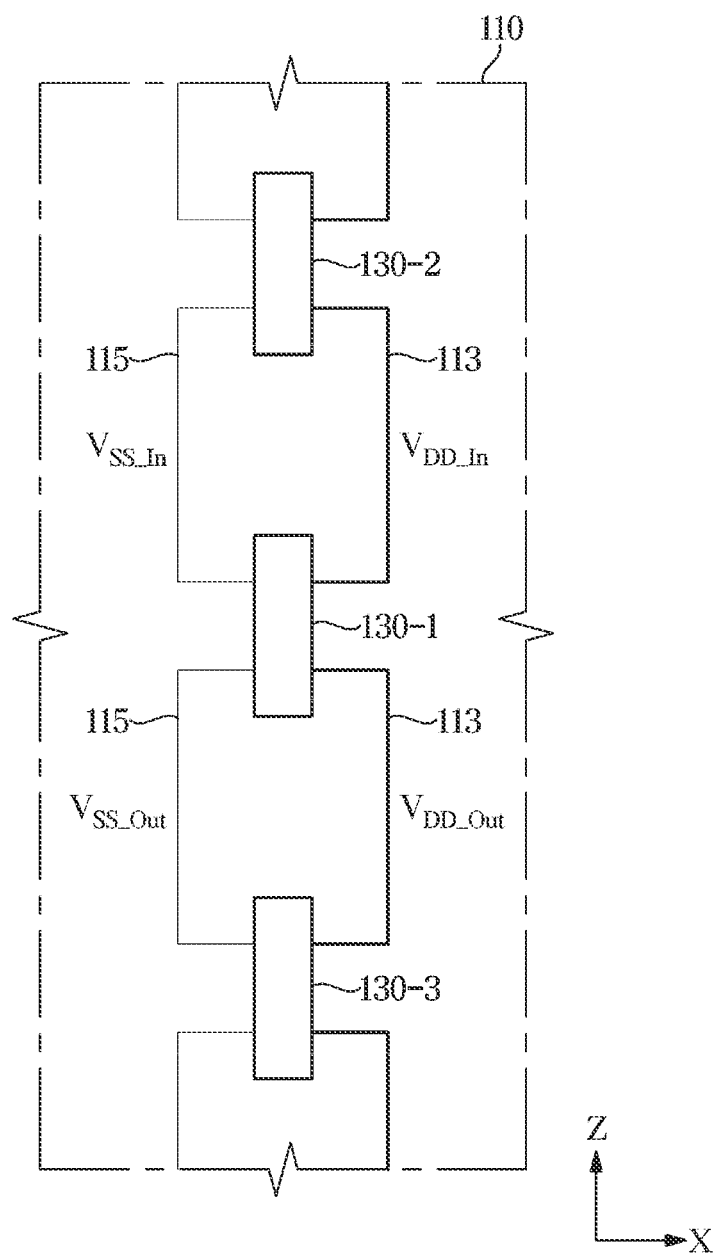
Figure 15:
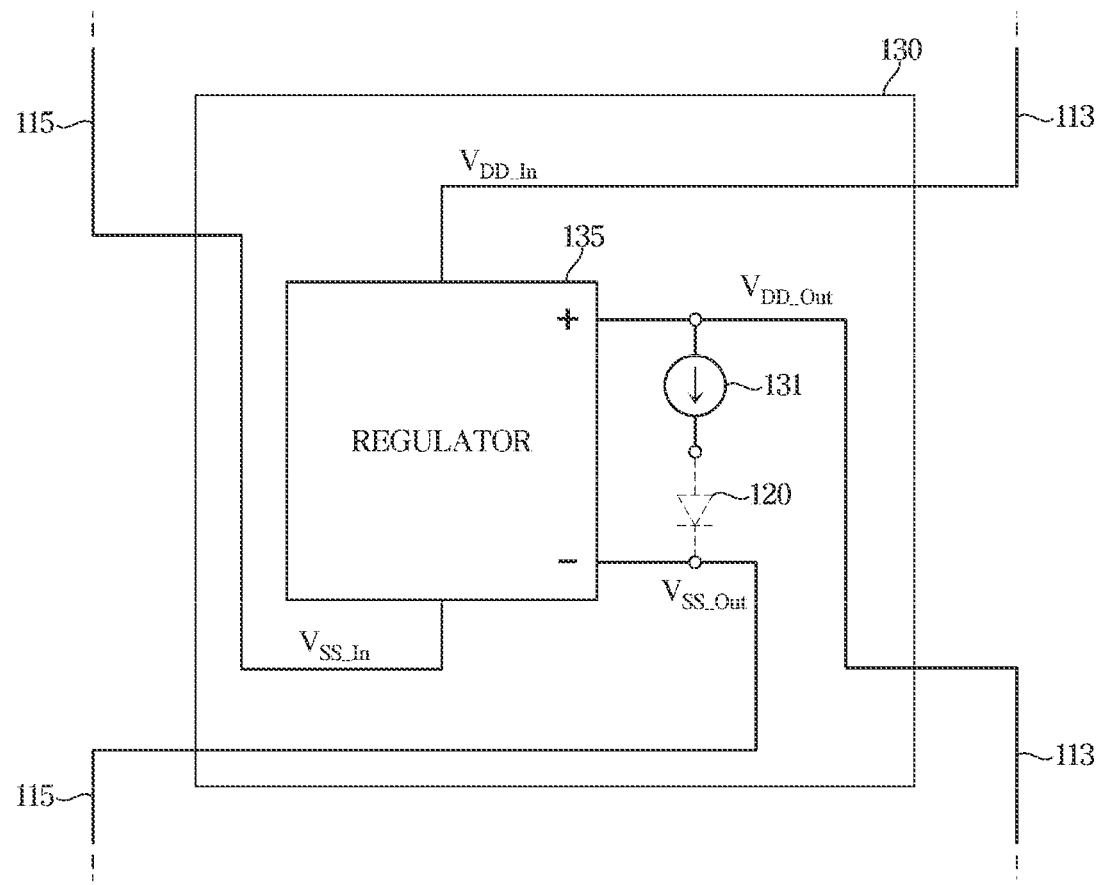
FIG. 15 is a view schematically illustrating an operation of the micro-pixel controller according to an embodiment.
Figure 16:
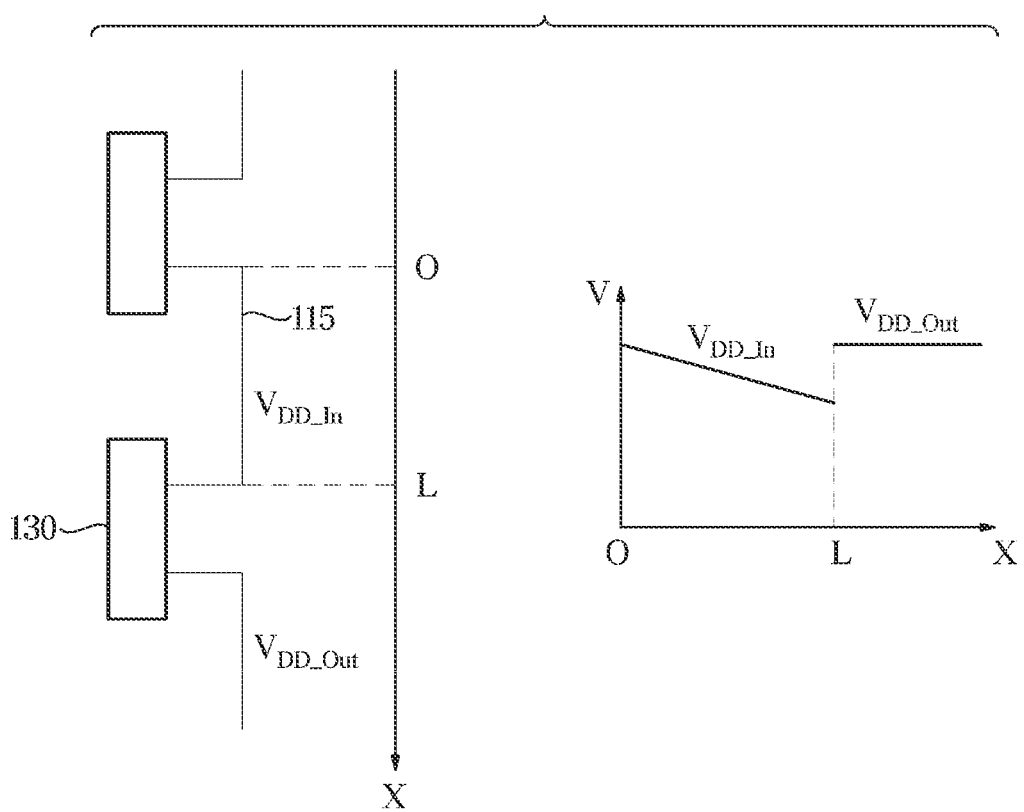
FIG. 16 is a view illustrating a state in which a regulator of the micro-pixel controller operates as an up-converter according to an embodiment.
Figure 17:
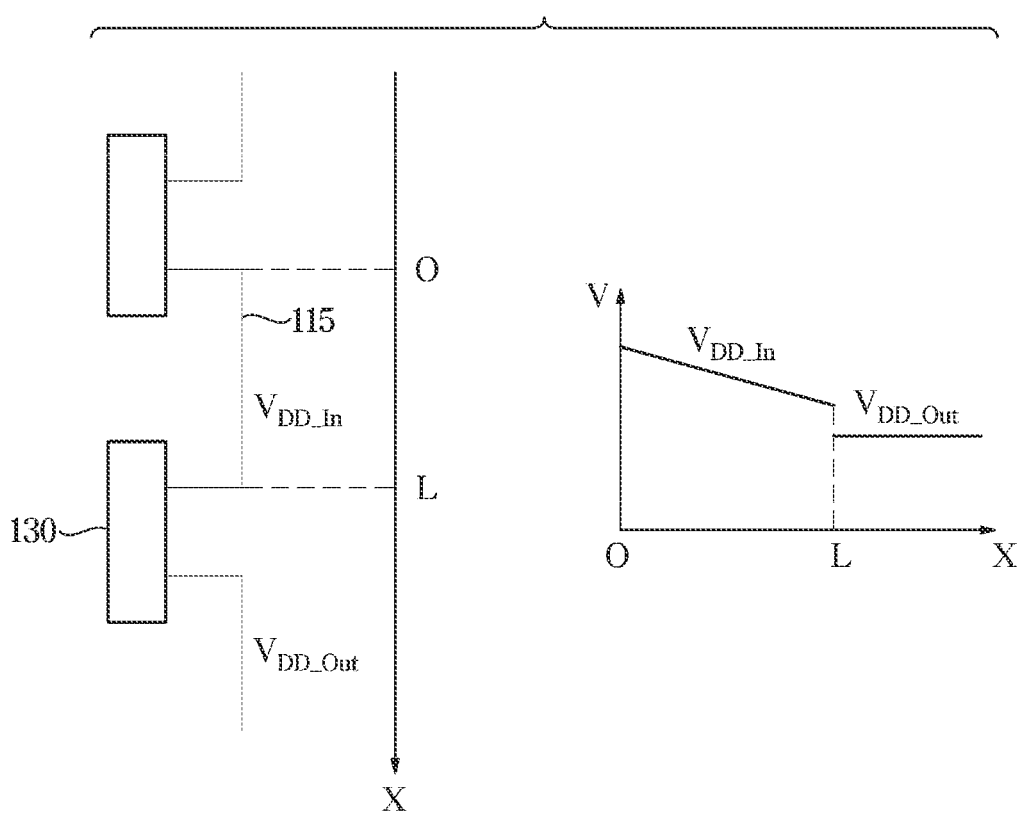
FIG. 17 is a view illustrating a state in which the regulator of the micro-pixel controller operates as a down-converter according to an embodiment.

FIGS. 13 and 14 are views schematically illustrating an electrical connection relationship between the micro-pixel controllers 130 in the display module 10 according to an embodiment, FIG. 15 is a view schematically illustrating an operation of the micro-pixel controller 130 according to an embodiment, FIG. 16 is a view illustrating a state in which a regulator of the micro-pixel controller 130 operates as an up-converter according to an embodiment, and FIG. 17 is a view illustrating a state in which a regulator of the micro-pixel controller operates as a down-converter according to an embodiment.

Referring to FIG. 13, the plurality of micro-pixel controllers 130 may be arranged in a plurality of rows and a plurality of columns on the first substrate 110 corresponding to the module substrate of the display module 10 according to an embodiment. For example, the plurality of micro-pixel controllers 130 may be disposed in a 2D array including A rows and B columns on the first substrate 110.

That is, the plurality of micro-pixel controllers 130 may be arranged in two dimensions on the first substrate 110. A micro-pixel controllers 130 may be arranged in the first direction (column direction), that is, along the Z-axis direction, and B micro-pixel controllers 130 may be arranged in the second direction (row direction), that is, the X-axis direction.

For example, each of the plurality of micro-pixel controllers 130 may receive voltages (the power voltage $V_{DD}$ and the reference voltage $V_{SS}$) from the power board 601 or the micro-pixel controller 130 in the previous row.

Particularly, the plurality of micro-pixel controllers 130 may include a plurality of first micro-pixel controllers 130a arranged in a first row 1300 and configured to receive a voltage from the power board 601, and a plurality of second micro-pixel controllers 130b arranged in a row 1350 other than the first row 1300, and configured to receive a voltage from a micro-pixel controller in the previous row.

In other words, the plurality of micro-pixel controllers 130 may include the plurality of first micro-pixel controllers 130a configured to receive a voltage from the power board 601 and configured to transfer the voltage to a micro-pixel controller 130 adjacent thereto in the column direction, and the plurality of second micro-pixel controllers 130b configured to receive the voltage from the micro-pixel controllers 130 adjacent thereto in the column direction.

That is, each of the plurality of first micro-pixel controllers 130a arranged in the first row 1300 may be electrically connected to the power board 601 to receive a voltage, and convert the input voltage into a target voltage, and then transfer the target voltage to the second micro-pixel controller 130b in the next row.

In addition, each of the second micro-pixel controllers 130b may be electrically connected to the first or second micro-pixel controller 130a or 130b in the previous row to receive a voltage, and convert the input voltage into a target voltage, and then transfer the target voltage to the second micro-pixel controller 130b in the next row.

FIG. 13 illustrates that a row in the uppermost of the first substrate 110 is the first row 1300 connected to the power board 601, but is not limited thereto. Alternatively, the position of the first row 1300 may vary, and thus a row in the lowermost or a row in the side end may correspond to the first row 1300 according to the connection position of the power board 601. Hereinafter, for convenience of description, a case in which the first row 1300 corresponds to a row in the uppermost will be described as an example.

Each of the plurality of micro-pixel controllers 130 may be electrically connected to micro-pixel controllers 130 disposed in the same column in a row adjacent thereto.

Particularly, each of the plurality of micro-pixel controllers 130 is electrically connected to the micro-pixel controller adjacent thereto in the column direction, and converts a voltage input from one of the micro-pixel controllers electrically connected thereto into a target voltage and transfers the target voltage to another one of the micro-pixel controllers electrically connected thereto.

That is, as shown in FIG. 14, one micro-pixel controller 130-1 may be electrically connected to a micro-pixel controller 130-2 disposed in the same column in the previous row and to a micro-pixel controller 130-3 disposed in the same column in the next row.

In other words, the micro-pixel controller 130-1 may be electrically connected to the micro-pixel controllers 130-2 and 130-3 adjacent thereto in the column direction, and convert a voltage, which is input from one micro-pixel controller 130-2 of the micro-pixel controllers 130-2 and 130-3 electrically connected thereto, into a target voltage and then transfer the target voltage to another micro-pixel controller 130-3 of the micro-pixel controllers 130-2 and 130-3 electrically connected thereto.

As shown in FIG. 13, each of the plurality of micro-pixel controllers 130 may be electrically connected to a micro-pixel controller 130 disposed in the same column in a row adjacent thereto through a power voltage wiring 113 and a reference voltage wiring 115.

The power voltage wiring 113 is disposed on the first substrate 110, and may electrically connect two micro-pixel controllers 130 disposed in the same column in adjacent rows. For example, the power voltage wiring 113 may transfer the power voltage $V_{DD}$ between the two micro-pixel controllers 130.

The reference voltage wiring 115 is disposed on the first substrate 110 and may electrically connect two micro-pixel controllers 130 disposed in the same column in adjacent rows. For example, the reference voltage wiring 115 may transfer the reference voltage $V_{SS}$ between the two micro-pixel controllers 130.

That is, each of the plurality of micro-pixel controllers 130 may be electrically connected to the micro-pixel controllers 130 adjacent thereto in the column direction through the power voltage wiring 113 and the reference voltage wiring 115.

For example, as shown in FIG. 14, one micro-pixel controller 130-1 may receive a power voltage $V_{DD\_In}$ and a reference voltage $V_{SS\_In}$ from a micro-pixel controller 130-2, which is arranged in the same column in the previous row, through the power voltage wiring 113 and the reference voltage wiring 115. Further, one micro-pixel controller 130-1 may transfer a power voltage $V_{DD\_Out}$ and a reference voltage $V_{SS\_Out}$ to a micro-pixel controller 130-3, which is arranged in the same column in the next row, through the power voltage wiring 113 and the reference voltage wiring 115.

In other words, the voltages $V_{DD\_Out}$ and $V_{SS\_Out}$ output from the micro-pixel controller 130-1 may correspond to voltages $V_{DD\_In}$ and $V_{SS\_In}$ to be input to the micro-pixel controller 130-2 in the next row.

The micro-pixel controller 130-1 may convert a power voltage $V_{DD\_In}$, which is input from one micro-pixel controller 130-2 of the micro-pixel controllers 130-2 and 130-3 electrically connected thereto, to a target power voltage $V_{DD\_Out}$, and transfer the target power voltage $V_{DD\_Out}$ to another one micro-pixel controller 130-3 of the micro-pixel controllers 130-2 and 130-3 electrically connected thereto.

Further, the micro-pixel controller 130-1 may convert a reference voltage $V_{SS\_In}$, which is input from one micro-pixel controller 130-2 of the micro-pixel controllers 130-2 and 130-3 electrically connected thereto, to a target reference voltage $V_{SS\_Out}$, and transfer the target reference voltage $V_{SS\_Out}$ to another one micro-pixel controller 130-3 of the micro-pixel controllers 130-2 and 130-3 electrically connected thereto.

Referring to FIG. 15, the micro-pixel controller 130 may include a regulator 135 configured to convert voltages $V_{DD\_In}$ and $V_{SS\_In}$ input from the power board 601 or the micro-pixel controller 130 in the previous row into target voltages $V_{DD\_Out}$ and $V_{SS\_Out}$.

For example, the target voltages $V_{DD\_Out}$ and $V_{SS\_Out}$ may be voltage values set to be used as the power voltage and the reference voltage in each of the plurality of micro-pixel controllers 130. Accordingly, the target voltages $V_{DD\_Out}$ and $V_{SS\_Out}$ may be used to supply a driving current to the inorganic LED 120.

That is, each of the plurality of micro-pixel controllers 130 may supply a driving current to the inorganic LED 120 forming two or more pixels P1, P2, P3, and P4 based on the target voltages $V_{DD\_Out}$ and $V_{SS\_Out}$ output from the regulator 135.

When the input voltages $V_{DD\_In}$ and $V_{SS\_In}$ do not correspond to a voltage value of a target voltage due to IR drop or noise in the power voltage wiring 113 and the reference voltage wiring 115, the regulator 135 may convert the input voltages $V_{DD\_In}$ and $V_{SS\_In}$ into the target voltages $V_{DD\_Out}$ and $V_{SS\_Out}$ by increasing or decreasing the input voltages $V_{DD\_In}$ and $V_{SS\_In}$.

The regulator 135 may convert the power voltage $V_{DD\_In}$ input from the micro-pixel controller 130 in the previous row into a target power voltage $V_{DD\_Out}$ and transfer the target power voltage $V_{DD\_Out}$ to the micro-pixel controller 130 in the next row. For example, the regulator 135 may supply the target power voltage $V_{DD\_Out}$ to the pixel circuit 131 that includes at least one thin film transistor and supplies the driving current $C_D$ to the inorganic LED 120.

Further, the regulator 135 may convert the reference voltage $V_{SS\_In}$ input from the micro-pixel controller 130 in the previous row into a target reference voltage $V_{SS\_Out}$ and transfer the target reference voltage $V_{SS\_Out}$ to the micro-pixel controller 130 in the next row. For example, the regulator 135 may supply the target reference voltage $V_{SS\_Out}$ to the plurality of inorganic LEDs 120 forming two or more pixels.

As a result, the regulator 135 may convert the power voltage $V_{DD\_In}$ input from one micro-pixel controller 130-2 of the micro-pixel controllers 130-2 and 130-3 electrically connected thereto into the target power voltage $V_{DD\_Out}$, and transfer the target power voltage $V_{DD\_Out}$ to another micro-pixel controller 130-3 of the micro-pixel controllers 130-2 and 130-3 electrically connected thereto.

Further, the regulator 135 may convert the reference voltage $V_{SS\_In}$ input from one micro-pixel controller 130-2 of the micro-pixel controllers 130-2 and 130-3 electrically connected thereto to the target reference voltage $V_{SS\_Out}$, and may transfer the target reference voltage $V_{SS\_Out}$ to another micro-pixel controller 130-3 of the micro-pixel controllers 130-2 and 130-3 electrically connected thereto.

The target voltages $V_{DD\_Out}$ and $V_{SS\_Out}$ output from the micro-pixel controller 130 may be input to a micro-pixel controller 130 in the next row through the power voltage wiring 113 and the reference voltage wiring 115. That is, the micro-pixel controller 130 may receive the target voltages $V_{DD\_Out}$ and $V_{SS\_Out}$ output from the micro-pixel controller 130 in the previous row as the input voltages $V_{DD\_In}$ and $V_{SS\_In}$.

For example, the voltages $V_{DD\_In}$ and $V_{SS\_In}$ input to the micro-pixel controller 130 may have a lower value than when being output from the micro-pixel controller 130 in the previous row due to IR drop according to the self-resistance of the power voltage wiring 113 and the reference voltage wiring 115.

For example, as shown in FIG. 16, the power voltage $V_{DD\_In}$ input to the micro-pixel controller 130 may have a lower value than when outputting from the micro-pixel controller 130 in the previous row due to IR drop that is proportional to a length L of the power voltage wiring 113.

Accordingly, as shown in FIG. 16, the regulator 135 may operate as an up-converter to increase the input power voltage $V_{DD\_In}$, which is decreased according to the IR drop, to the target power voltage $V_{DD\_Out}$, and output the target power voltage $V_{DD\_Out}$. For example, the regulator 135 may operate as an up-converter to increase the input power voltage $V_{DD\_In}$ to a value of the target power voltage, and output the target power voltage to the pixel circuit 131 of its own micro-pixel controller 130 and to the micro-pixel controller 130 of the next row.

Further, the voltages $V_{DD\_In}$ and $V_{SS\_In}$ input to the micro-pixel controller 130 may be higher than the target voltages $V_{DD\_Out}$ even when IR drop occurs caused by the device characteristics of the micro-pixel controller 130 and the power voltage wiring 113 and the reference voltage wiring 115 or caused by noise.

For example, as shown in FIG. 17, the power voltage $V_{DD\_In}$ input to the micro-pixel controller 130 may be higher than the target voltages $V_{DD\_Out}$ despite of the IR drop that is proportional to the length L of the power voltage wiring 113.

Accordingly, as shown in FIG. 17, the regulator 135 may operate as a down converter to reduce the input power voltage $V_{DD\_In}$ to the target power voltage $V_{DD\_Out}$ and output the target power voltage $V_{DD\_Out}$. For example, the regulator 135 may operate as a down-converter to decrease the input power voltage $V_{DD\_In}$ to a value of the target power voltage, and output the target power voltage to the pixel circuit 131 of its own micro-pixel controller 130 and to the micro-pixel controller 130 of the next row.

As mentioned above, in the display module 10 according to an embodiment, because the micro-pixel controller 130 includes the regulator 135 configured to operate as the up-converter or the down-converter, the micro-pixel controller 130 may control the inorganic LED 120 with the same magnitude of the voltages $V_{DD\_Out}$ and $V_{SS\_Out}$ regardless of the magnitude of the voltage $V_{DD\_In}$ and $V_{SS\_In}$ input to the micro-pixel controller 130. That is, by controlling the inorganic LED 120 with the same target voltage at all times regardless of the IR drop, the micro-pixel controller 130 may provide the intended driving current $C_D$ to the inorganic LED 120 so as to provide the intended luminance and thus it is possible to prevent a decrease in the luminance and to prevent Mura effects.

Further, the display module 10 according to an embodiment may allow the output voltage of the micro-pixel controller 130 to be transferred to the micro-pixel controller 130 in the next row, and thus it is possible to reduce the length of the power voltage wiring 113 and the reference voltage wiring 115 in comparison with the case in which each of the micro-pixel controllers 130 is electrically connected to the power board 601. Therefore, it is possible to minimize the IR drop. Further, because the output voltage of the micro-pixel controller 130 has a voltage value, in which the voltage drop caused by the IR drop is compensated by the regulator 135, it is possible to significantly reduce the IR drop in comparison with the case in which each of the micro-pixel controllers 130 is electrically connected to the power board 601.

In the above description, it has been described that each of the plurality of micro-pixel controllers 130, which is arranged on the first substrate 110 of the display module 10, is electrically connected to the micro-pixel controller 130, which is in the same column in a row adjacent thereto, through the power voltage wiring 113 and the reference voltage wiring 115.

However, according to embodiments, each of the plurality of micro-pixel controllers 130 may be electrically connected to the micro-pixel controller 130, which is in the same column in a row adjacent thereto, only through the power voltage wiring 113. For example, each of the plurality of micro-pixel controllers 130 may convert the power voltage input from the micro-pixel controller in the previous row into the target power voltage and transfer the target power voltage to the micro-pixel controller in the next row. For example, the reference voltage $V_{SS}$ may be directly applied from the power board 601 to the inorganic LED 120 or applied from the power board 601 to the inorganic LED 120 through each micro-pixel controller 130.

Alternatively, according to embodiments, each of the plurality of micro-pixel controllers 130 may be electrically connected to the micro-pixel controller 130, which is in the same column in a row adjacent thereto, only through the reference voltage wiring 115. For example, each of the plurality of micro-pixel controllers 130 may convert the reference voltage input from the micro-pixel controller in the previous row into the target reference voltage and transfer the target reference voltage to the micro-pixel controller in the next row. For example, the power voltage $V_{DD}$ may be directly supplied from the power board 601 to the micro-pixel controller 130.

Figure 18:
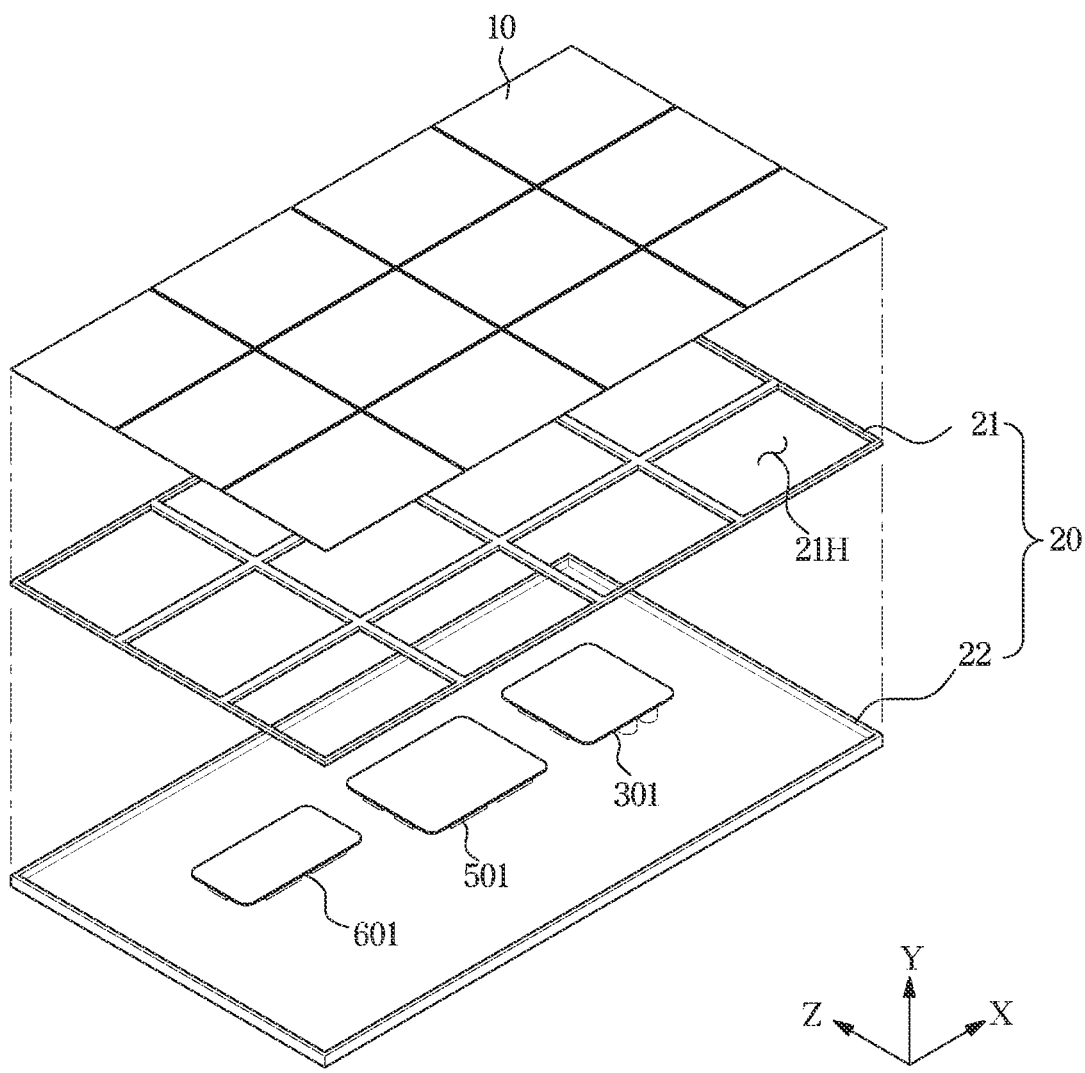
FIG. 18 is a view illustrating an example of a method for coupling the plurality of display modules to a housing in the display apparatus according to an embodiment.

FIG. 18 is a view illustrating an example of a method for coupling the plurality of display modules 10 to the housing in the display apparatus 1 according to an embodiment.

As mentioned above, the plurality of the display module 10 may be arranged in a 2D matrix and fixed on the housing 20. Referring to the example of FIG. 18, the plurality of display modules 10 may be installed in a frame 21 in a lower side thereof, and the frame 21 may have a 2D mesh structure in which a portion of the frame 21 corresponding to the plurality of display modules 10 is opened.

Particularly, an opening 21H may be formed in the frame 21 in the same number as the number of display modules 10, and the openings 21H may have the same arrangement as the plurality of display modules 10.

On the other hand, the plurality of display modules 10 may be mounted on the frame 21 by using a magnetic force by a magnet, by being coupled by a mechanical structure, or by being bonded by an adhesive. There is no limitation on the manner in which the display module 10 is mounted on the frame 21.

The driving board 501, the main board 301, and the power board 601 may be disposed under the frame 21, and may be electrically connected to the plurality of display modules 10 through the opening 21H formed in the frame 21.

A lower cover 22 may be coupled to a lower portion of the frame 21, and the lower cover 22 may form a lower exterior of the display apparatus 1.

In the above example, the case in which the display module 10 is arranged in two dimensions has been described as an example, but is not limited thereto. Therefore, the display module 10 may be arranged in one dimension, and, for example, the structure of the frame 21 may be changed into a one-dimensional mesh structure.

As mentioned above, the display apparatus 1 according to an embodiment may implement a large-size screen by tiling and fixing the plurality of display modules 10 to the housing 20. Accordingly, in the display apparatus 1 according to an embodiment, it is possible to design the power voltage wiring 113 and the reference voltage wiring 115, which is to transfer the power voltage $V_{DD}$ and the reference voltage $V_{SS}$, to be shorter as compared to when a related art substrate for realizing a large-size screen is applied. Therefore, it is possible to minimize the IR drop that is proportional to the length of the wiring.

Figure 19:
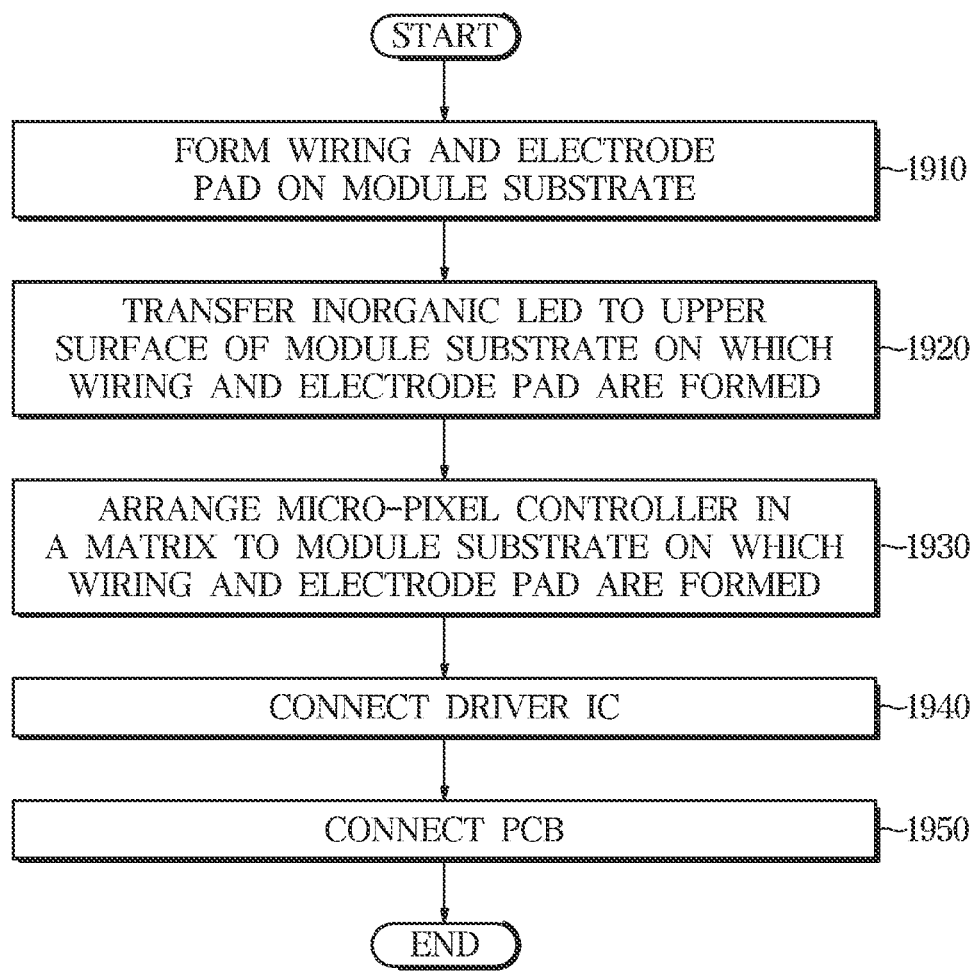
FIG. 19 is a flow chart illustrating a method for manufacturing the display module according to an embodiment.

FIG. 19 is a flow chart illustrating a method for manufacturing the display module 10 according to an embodiment, and FIGS. 20 to 24 are views illustrating the display module 10 manufactured by some of steps shown in FIG. 19.

Referring to FIG. 19, a wiring and an electrode pad are formed on a module substrate (operation 1910).

The module substrate may refer to the first substrate 110 described above, and wiring and electrode pads may be formed on both of the upper surface and the lower surface of the first substrate 110. For example, a layer of a metal material such as copper is formed on the upper surface of the first substrate 110, and a photolithography process, which includes processes such as application, exposure, and development of a photosensitive material, and an etching process in which an unnecessary portion is selectively removed, are performed. Therefore, the wiring and electrode pad may be formed on the first substrate 110.

Figure 20:
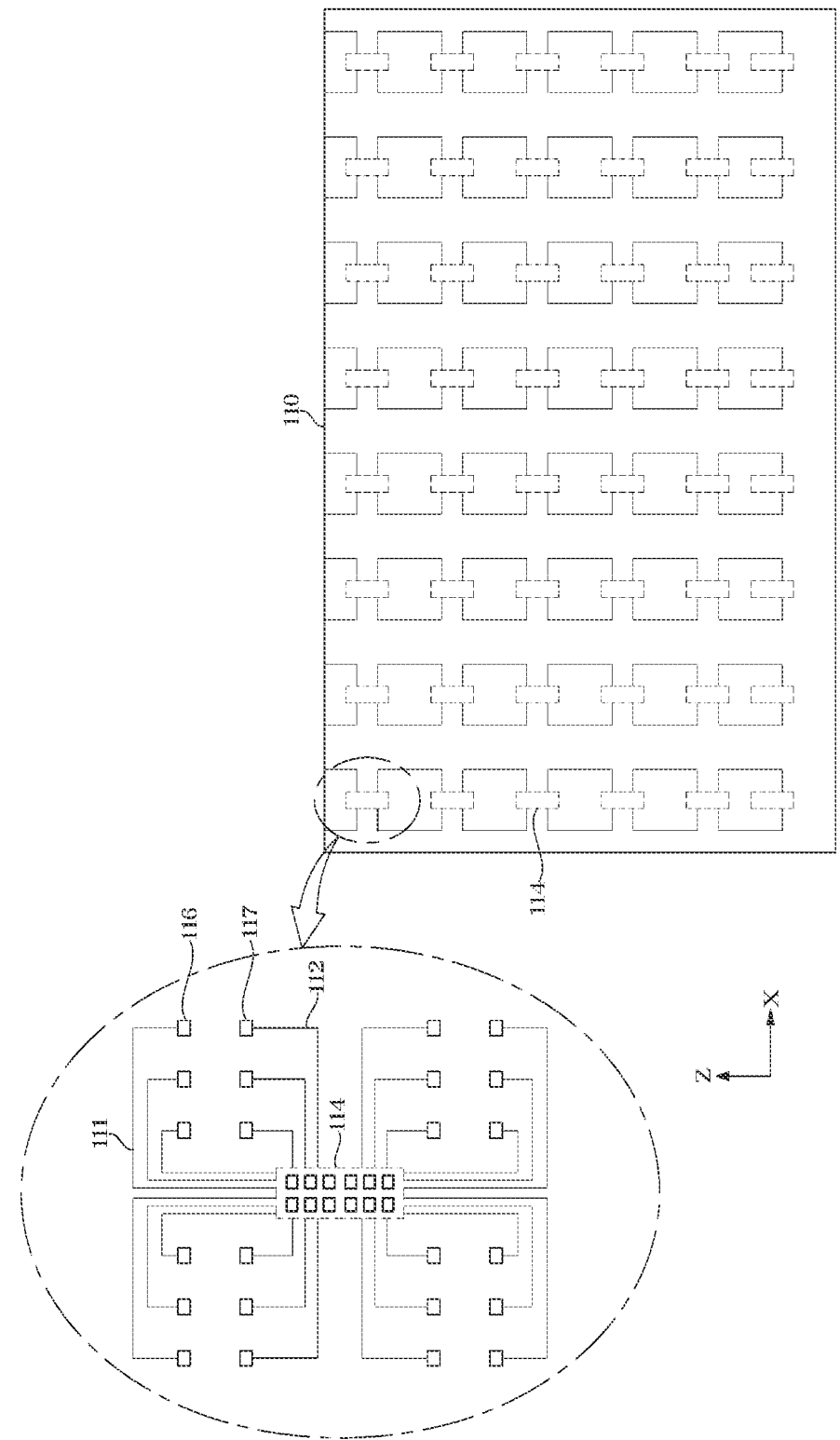
FIGS. 20, 21, 22, 23, and 24 are views illustrating the display module manufactured by some of steps shown in FIG. 19.

FIG. 20 is a view illustrating an upper surface of the first substrate 110 on which wirings and electrode pads are formed.

As illustrated in FIG. 20, a controller connection pad 114, to which the micro-pixel controller 130 is electrically connected, an anode connection pad 116, to which the anode of the inorganic LED 120 is electrically connected, and a cathode connection pad 117, to which the cathode of the inorganic LED 120 is electrically connected, may be formed on the upper surface of the first substrate 110 through the above-mentioned process.

The controller connection pad 114 is an electrode pad configured to electrically connect the micro-pixel controller 130 to the first substrate 110, and the controller connection pad 114 may be arranged in a plurality of rows and a plurality of columns on the upper surface of the first substrate 110 to allow the micro-pixel controller 130 to be arranged in a plurality of rows and a plurality of columns.

For example, on the upper surface of the first substrate 110, the power voltage wiring 113 and the reference voltage wiring 115 may be formed to allow the controller connection pad 114 to be electrically connected to a controller connection pad 114 in the same column in a row adjacent thereto. Accordingly, the controller connection pad 114 may be electrically connected to a controller connection pad 114 in the same column in a row adjacent thereto, and the micro-pixel controller 130 may be electrically connected to a micro-pixel controller 130 in the same column in a row adjacent thereto.

In an embodiment, the arrangement of certain elements in the same column may include not only a case in which the elements are arranged in a column that is numerically completely identical, but also a case in which elements are arranged in a column that is identical within a certain error range. In addition, in an embodiment, the arrangement of certain elements in the same row may include not only a case in which the elements are arranged in a row that is numerically completely identical, but also a case in which the elements are arranged in a row that is identical within a certain error range.

Further, a voltage wiring configured to electrically connect the controller connection pad 114 in the first row to the power board 601 may be formed on the upper surface of the first substrate 110.

In addition, the anode wiring 111 configured to electrically connect the controller connection pad 114 to the anode connection pad 116 of the control target, and the cathode wiring 112 configured to electrically connect the controller connection pad 114 to the cathode connection pad 117 of the control target may be formed on the upper surface of the first substrate 110. Accordingly, the micro-pixel controller 130 may be electrically connected to the inorganic LED 120 through the anode wiring 111 and the cathode wiring 112.

Although not shown in FIG. 20, an upper wiring configured to electrically connect the controller connection pad 114 to the driver IC 200 may be formed on the upper surface of the first substrate 110. The upper wiring may transfer the gate signal and the data signal output from the driver IC 200 to the micro-pixel controller 130.

Referring again to FIG. 19, the inorganic LED 120 is transferred to the upper surface of the module substrate on which the wiring and electrode pad are formed (operation 1920).

As mentioned above, the inorganic LED 120 may be a micro-LED. The micro-LED on a wafer or a temporary substrate may be picked up by a transfer mechanism and then transferred to the first substrate 110. For example, the inorganic LED 120 may be transferred such that the anode and the cathode face the upper surface of the first substrate 110. Any of known techniques such as a method using a laser, a method using a stamp, and a method using a roller may be used as the transfer method.

In addition, according to the connection method between the inorganic LED 120 and the electrode pad, a soldering material or a conductive adhesive may be arranged or applied on the anode connection pad 116 and the cathode connection pad 117 formed on the upper surface of the first substrate 110.

Figure 21:
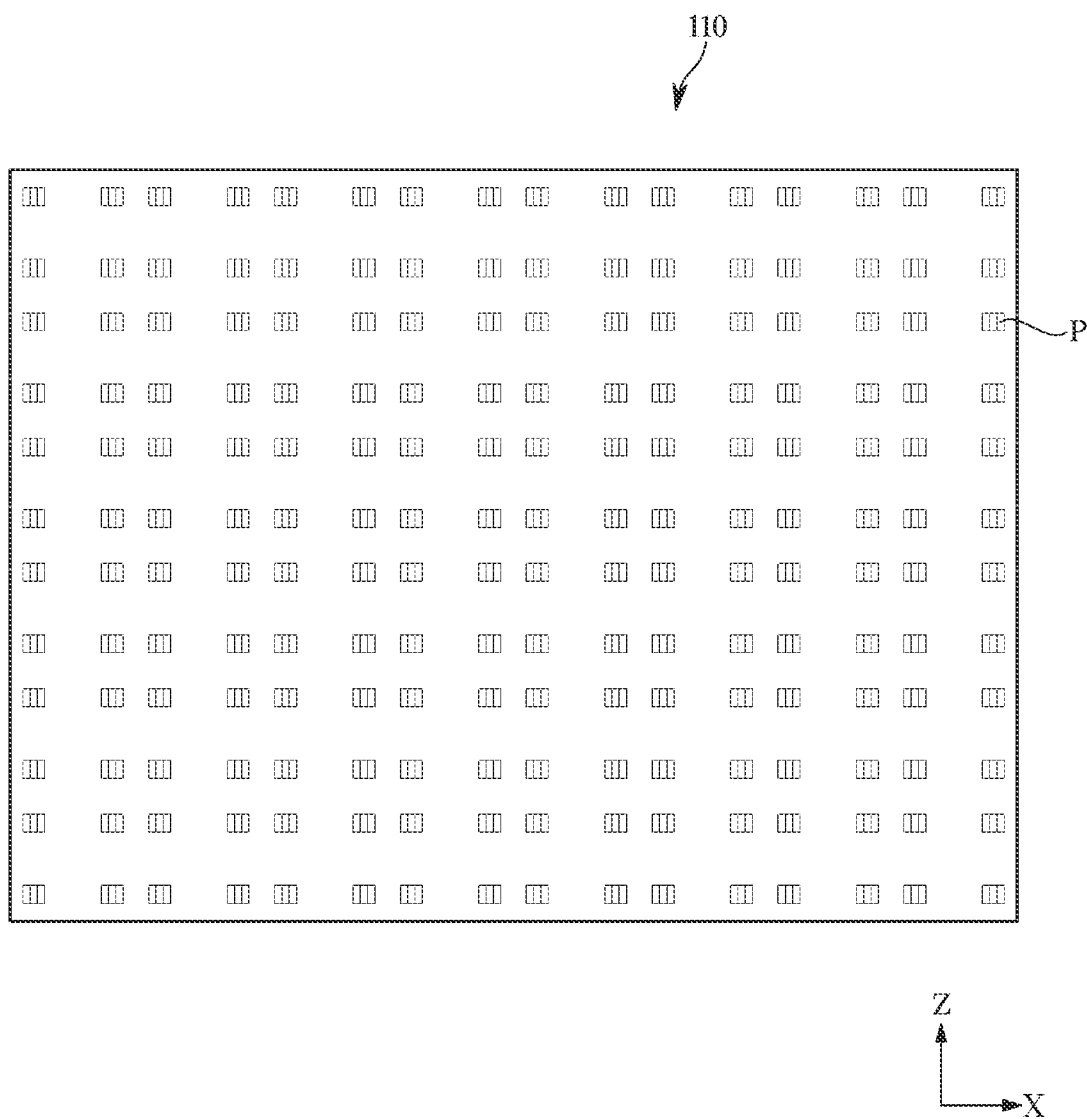

FIG. 21 is a view illustrating the upper surface of the first substrate 110 to which the inorganic LED 120 is transferred. By transferring the inorganic LED 120 to the upper surface of the first substrate 110 on which a soldering material or a conductive adhesive is disposed or applied, the anode and the anode connection pad 116 of the inorganic LED 120 may be electrically connected and the cathode and the cathode connection pad 117 of the inorganic LED 120 may be electrically connected, as shown in FIG. 21.

Referring again to FIG. 19, the micro-pixel controller 130 is arranged in a matrix on the module substrate, on which the wiring and the electrode pad are formed (operation 1930).

On the upper surface of the first substrate 110 corresponding to the module substrate, the controller connection pads 114, to which the micro-pixel controller 130 may be electrically connected, may be arranged in a plurality of rows and a plurality of columns.

For example, the micro-pixel controller 130 may be disposed on the controller connection pad 114 so as to be electrically connected to the first substrate 110. In other words, by electrically connecting the lower connection pad provided on the micro-pixel controller 130 to the controller connection pad 114 formed on the upper surface of the first substrate 110, the micro-pixel controller 130 may be arranged on the first substrate 110. For example, the lower connection pad and the controller connection pad 114 may be electrically connected to each other through the soldering or the conductive adhesive.

The pixel circuit 131 for controlling the inorganic LED 120 on the first substrate 110 is formed. The description of the structure and operation of the micro-pixel controller 130 may be the same as the above-mentioned embodiment of the display module 10.

On the other hand, prior to mounting the micro-pixel controller 130 on the first substrate 110, a circuit inspection may be individually performed, and only the micro-pixel controller 130, which is determined to be a good product by the circuit inspection, may be mounted on the first substrate 110. Therefore, in comparison with the case of directly mounting the thin film transistor circuit on the module substrate, it is possible to facilitate the circuit inspection and the replacement of defective products.

Figure 22:
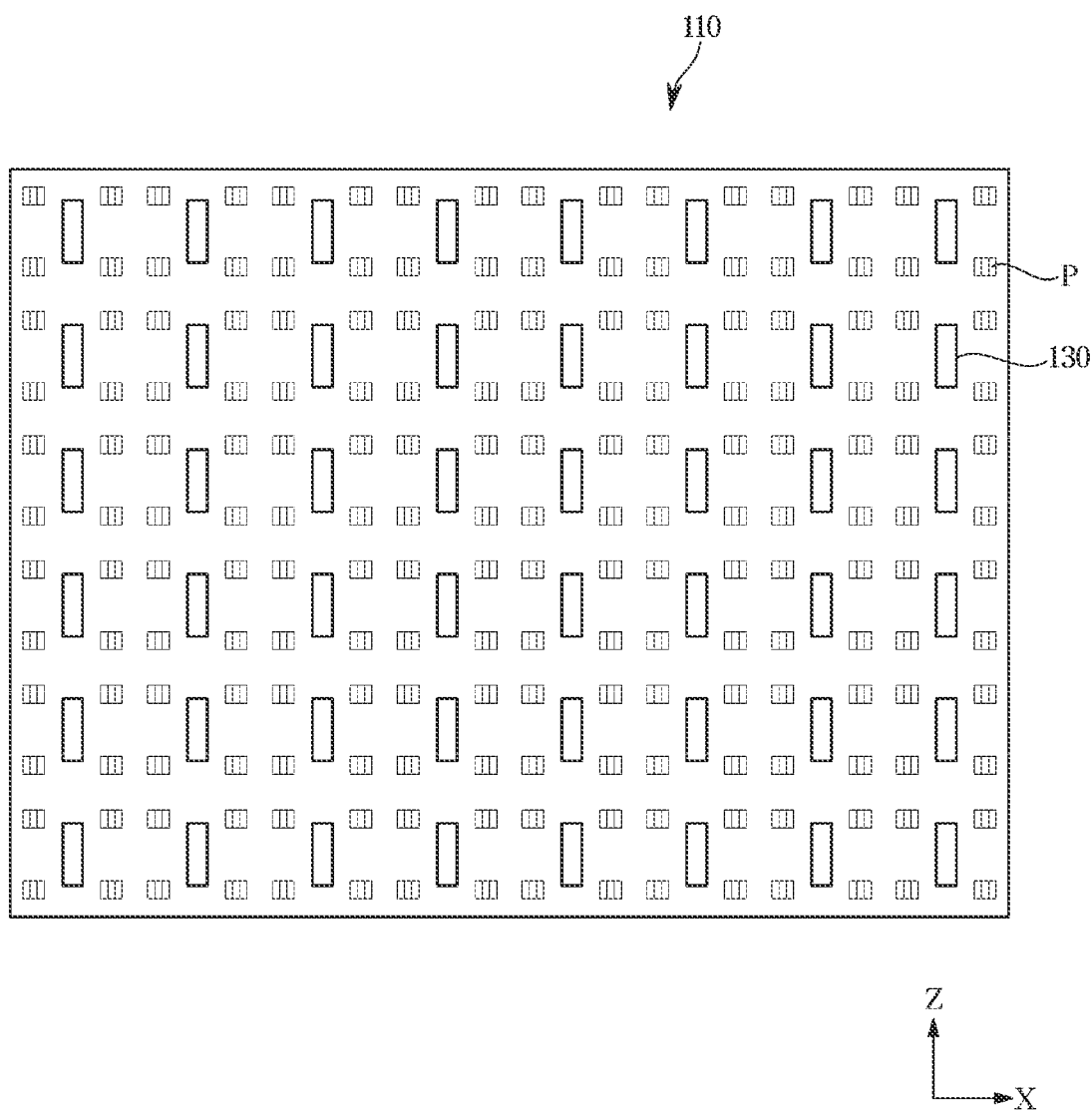

FIG. 22 is a view illustrating the upper surface of the first substrate 110 on which the micro-pixel controller 130 is arranged. As illustrated in FIG. 22, on the upper surface of the first substrate 110, the micro-pixel controller 130 may be arranged in a 2D array including a plurality of rows and a plurality of columns. Each of the plurality of micro-pixel controllers 130 may be electrically connected to the micro-pixel controller 130, which is disposed in the same column in a row adjacent thereto, through the power voltage wiring 113 and the reference voltage wiring 115.

For example, on the first substrate 110, the plurality of micro-pixel controllers 130 may be disposed in a 2D array including A rows and B columns.

That is, the plurality of micro-pixel controllers 130 may be two-dimensionally arranged on the first substrate 110, and A micro-pixel controllers 130 may be arranged in the first direction (column direction), that is, along the Z-axis direction, and the B micro-pixel controllers 130 may be arranged in the second direction (row direction), that is, the X-axis direction.

The plurality of micro-pixel controllers 130 may include the plurality of first micro-pixel controllers 130*a* configured to receive a voltage from the power board 601 and configured to transfer the voltage to a micro-pixel controller 130 adjacent thereto in the column direction, and the plurality of second micro-pixel controllers 130*b* configured to receive the voltage from the micro-pixel controllers 130 adjacent thereto in the column direction.

Accordingly, each of the plurality of micro-pixel controllers 130 may receive voltages (power voltage and reference voltage) from the micro-pixel controllers 130 in the previous row, and convert the input voltage into a target voltage, and then transfer the target voltage to the micro-pixel controller 130 in the next row.

Referring again to FIG. 19, the driver IC is connected to the module substrate (operation 1940).

The driver IC 200 may be electrically connected to the first substrate 110 by including one of various bonding methods such as Chip on Film (COF) or Film on Glass (FOG) bonding, Chip on Glass (COG) bonding, Tape Automated Bonding (TAB), etc.

Figure 23:
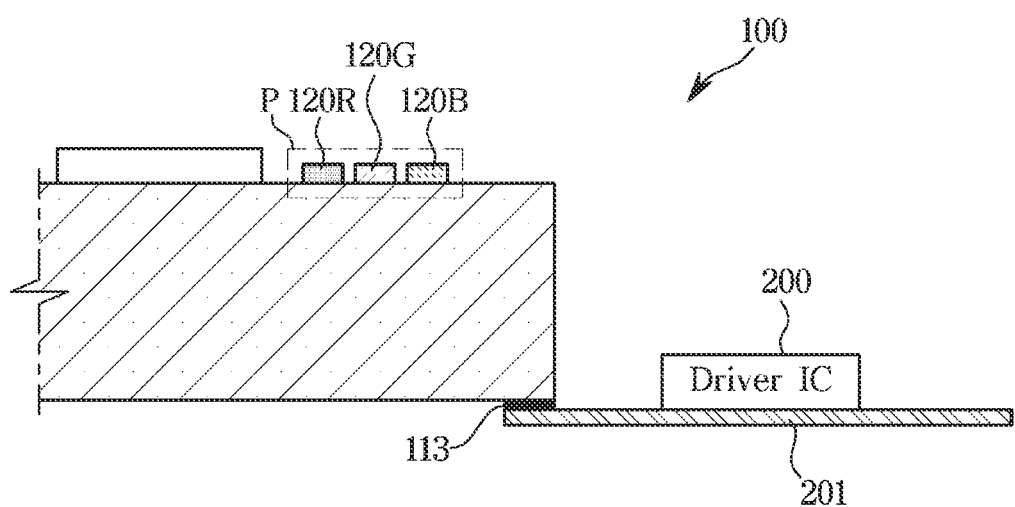

FIG. 23 is a side cross-sectional view of the first substrate 110 to which the driver IC 200 is connected. As an example, when COF bonding is used, the driver IC 200 may be mounted on the film 201, and one end of the film 201 on which the driver IC 200 is mounted may be electrically connected to the first substrate 110, as shown in FIG. 23.

For example, one end of the film 201, on which the driver IC 200 is mounted, may be electrically connected to the lower wiring pad provided on the lower surface of the first substrate 110, and the lower electrode pad electrically connected to the film 201, on which the driver IC 200 is mounted, may be connected to the upper wiring, on which the micro-pixel controller 130 is disposed, through the via-hole wiring or the side wiring. The micro-pixel controller 130 may receive a gate signal and a data signal from the driver IC 200 through the corresponding upper wiring.

Referring again to FIG. 19, the FPCB is connected to the module substrate (operation 1950).

Figure 24:
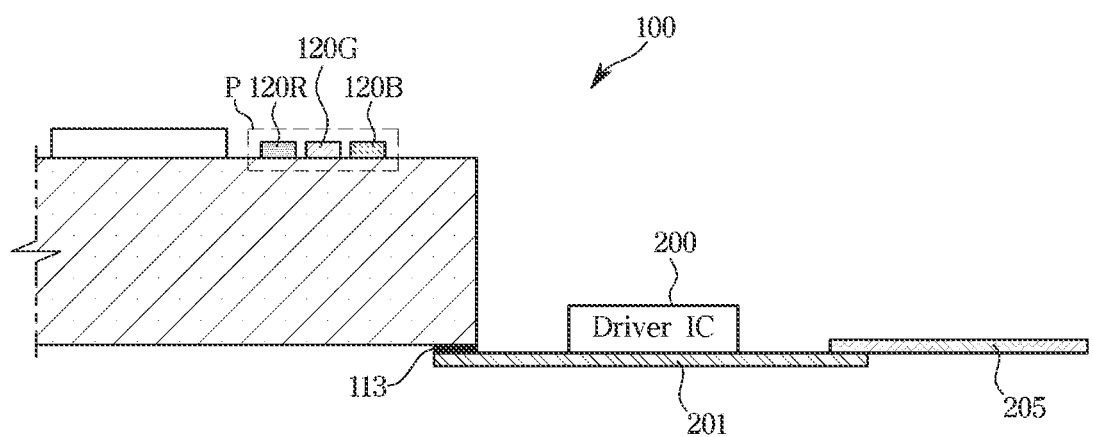

FIG. 24 is a side cross-sectional view of the first substrate 110 to which the FPCB 205 is connected. As mentioned above, when COF bonding is used, the other end of the film 201, on which the driver IC 200 is mounted may be electrically connected to the FPCB 205, as shown in FIG. 24.

The FPCB 205 connected to the film 201, on which the driver IC 200 is mounted, may be electrically connected to the driving board 501 to transmit a timing control signals and image data output from the driving board 501 to the driver IC 200.

In addition, the first substrate 110 may be connected to a FPCB for receiving power, and a FPCB for supplying power may be electrically connected to the power board 601 to supply a power voltage $V_{DD}$ or a reference voltage $V_{SS}$ to the micro-pixel controller 130 or the inorganic LED 120. The power board 601 may be electrically connected to the first substrate 110 through the FPCB, and the power board 601 may supply the power voltage $V_{DD}$ and the reference voltage $V_{SS}$ by being electrically connected to the micro-pixel controller 130 in the first row 1300 arranged on the first substrate 110 through the wiring.

Meanwhile, the method of manufacturing the display module according to an embodiment may include not only all of the above-described processes, but may also include only some processes. Alternatively, another process may be further added.

For example, the process of forming a wiring and an electrode pad on the first substrate 110 (operation 1910) may be excluded. The process of forming the wiring and electrode pad on the first substrate 110 (operation 1910) and the process of transferring the inorganic LED to the first substrate 110 (operation 1920) may be excluded. The process of connecting the driver IC (operation 1940) and connecting the PCB (operation 1950) may be excluded.

Meanwhile, embodiments may be embodied in the form of a recording medium storing instructions executable by a computer. The instructions may be stored in the form of program code and, when executed by a processor, may generate a program module to perform the operations of embodiments. The recording medium may be embodied as a computer-readable recording medium.

The computer-readable recording medium includes all kinds of recording media in which instructions which can be decoded by a computer are stored. For example, there may be a Read Only Memory (ROM), a Random Access Memory (RAM), a magnetic tape, a magnetic disk, a flash memory, and an optical data storage device.

In accordance with an embodiment, a display module includes a plurality of pixels and further includes: a plurality of LEDs arranged on a substrate, each of the plurality of pixels including two or more inorganic LEDs among the plurality of inorganic LEDs, and a plurality of micro-pixel controllers arranged in a first direction and a second direction on the substrate. Each of the plurality of micro-pixel controllers is configured to control a group of pixels among the plurality of pixels that is disposed in an area of each of the plurality of micro-pixel controllers.

The plurality of micro-pixel controllers is electrically interconnected so that one micro-pixel controller is electrically connected to one or more micro-pixel controllers adjacent thereto among the plurality of micro-pixel controllers in at least one of the first direction or a direction opposite to the first direction.

The plurality of micro-pixel controllers includes first micro-pixel controllers which are linearly aligned in the second direction, and are configured to receive input voltage corresponding to a first power from a power board and adjust the first power to have a value of a target voltage, and second micro-pixel controllers extending away from the first micro-pixel controllers in the first direction.

Each micro-pixel controller of a first part of the second micro-pixel controllers is electrically connected to a corresponding micro-pixel controller of the first micro-pixel controllers adjacent thereto in the direction opposite to the first direction and a corresponding micro-pixel controller of a second part of the second micro-pixel controllers extending away from the first part of the second micro-pixel controllers in the first direction, and is configured to receive the input voltage, as a second power, corresponding to the adjusted first power and adjust the second power to have the value of the target voltage.

Each micro-pixel controller of the second part of the second micro-pixel controllers is electrically connected to a corresponding micro-pixel controller of the first part of the second micro-pixel controllers adjacent thereto in the direction opposite to the first direction and to a corresponding micro-pixel controller of the second part of the second micro-pixel controllers in the first direction, and is configured to receive the input voltage, as a third power, corresponding to the adjusted second power, and adjust the third power to have the value of the target voltage.

Each of the plurality of micro-pixel controllers includes a regulator configured to adjust the input voltage to have the value of the target voltage, and a pixel controller configured to receive the adjusted input voltage as the target voltage, and supply a driving current to the plurality of inorganic LEDs forming the group of pixels, the driving current corresponding to the adjusted input voltage.

While the present disclosure has been particularly described with reference to exemplary embodiments, it should be understood by those of skilled in the art that various changes in form and details may be made without departing from the spirit and scope of the present disclosure.

What is claimed is:
1. A display module comprising:
   a first substrate;
   a plurality of pixels comprising a plurality of inorganic light emitting diodes (LEDs) arranged on the first substrate, each pixel of the plurality of pixels including at least two inorganic LEDs among the plurality of inorganic LEDs; and
   a plurality of micro-pixel controllers two-dimensionally arranged in a first direction and a second direction on the first substrate, each micro-pixel controller of the plurality of micro-pixel controllers being configured to control at least two pixels among the plurality of pixels,
   wherein each micro-pixel controller of the plurality of micro-pixel controllers is electrically connected to micro-pixel controllers adjacent thereto, and is configured to convert a voltage input from one of the micro-pixel controllers that is electrically connected thereto in a direction opposite to the first direction into a target voltage and supply the target voltage to another micro- pixel controller of the micro-pixel controllers electrically connected thereto in the first direction.

2. The display module of claim 1, wherein each of the plurality of micro-pixel controllers comprises:
   a second substrate; and
   at least one thin film transistor (TFT) arranged on the second substrate.

3. The display module of claim 2, wherein the at least one TFT is configured to switch inorganic LEDs of the at least two pixels, and supply a driving current to inorganic LEDs of the at least two pixels.

4. The display module of claim 3, wherein each micro-pixel controller of the plurality of micro-pixel controllers is further configured to supply the driving current to the inorganic LEDs of the at least two pixels based on the target voltage.

5. The display module of claim 1, wherein the plurality of micro-pixel controllers comprise:
   a plurality of first micro-pixel controllers which are aligned in the second direction, and are configured to receive power from a power board and supply the voltage corresponding to the power to micro-pixel controllers that are adjacent thereto in the first direction; and
   a plurality of second micro-pixel controllers configured to receive the voltage from the plurality of first micro-pixel controllers or the micro-pixel controllers adjacent thereto in the direction opposite to the first direction.

6. The display module of claim 1, wherein each micro-pixel controller of the plurality of micro-pixel controllers is further configured to convert the input voltage into the target voltage by increasing or decreasing the input voltage.

7. The display module of claim 2, wherein each micro-pixel controller of the plurality of micro-pixel controllers is further configured to convert a power voltage input from the one of the micro-pixel controllers into a target power voltage, and supply the target power voltage to the other micro-pixel controller, and
   wherein the power voltage is included in the input voltage.

8. The display module of claim 7, wherein each micro-pixel controller of the plurality of micro-pixel controllers comprises at least one pixel circuit comprising the at least one TFT to supply a driving current to the inorganic LEDs of the at least two pixels, and supply the target power voltage to the at least one pixel circuit.

9. The display module of claim 2, wherein each micro-pixel controller of the plurality of micro-pixel controllers is further configured to convert a reference voltage input from the one of the micro-pixel controllers into a target reference voltage, and supply the target reference voltage to the other micro-pixel controller, and
   wherein the reference voltage is included in the input voltage.

10. The display module of claim 9, wherein each micro-pixel controller of the plurality of micro-pixel controllers is further configured to supply the target reference voltage to the plurality of inorganic LEDs forming the at least two pixels.

11. A display apparatus comprising:
    a plurality of display modules; and
    a frame configured to support the plurality of display modules,
    wherein each of the plurality of display modules further comprises:
    a first substrate;
    a plurality of pixels arranged in two dimensions and comprising a plurality of inorganic light emitting diodes (LEDs) arranged on the first substrate, each pixel of the plurality of pixels including at least two inorganic LEDs among the plurality of inorganic LEDs; and
    a plurality of micro-pixel controllers two-dimensionally arranged in a first direction and a second direction on the first substrate, each micro-pixel controller of the plurality of micro-pixel controllers being configured to control at least two pixels among the plurality of pixels,
    wherein each micro-pixel controller of the plurality of micro-pixel controllers is electrically connected to micro-pixel controllers adjacent thereto, and is configured to convert a voltage input from one of the micro-pixel controllers that is electrically connected thereto in a direction opposite to the first direction into a target voltage and supply the target voltage to another micro-pixel controller of the micro-pixel controllers that is electrically connected thereto in the first direction.

12. The display apparatus of claim 11, wherein each micro-pixel controller of the plurality of micro-pixel controllers comprises:
    a second substrate; and
    at least one thin film transistor (TFT) arranged on the second substrate,
    wherein the at least one TFT is configured to switch the plurality of inorganic LEDs forming the at least two pixels, and supply a driving current to the plurality of inorganic LEDs forming the at least two pixels.

13. The display apparatus of claim 12, wherein each micro-pixel controller of the plurality of micro-pixel controllers is further configured to supply the driving current to the plurality of inorganic LEDs forming the at least two pixels based on the target voltage.

14. The display apparatus of claim 11, further comprising a power board configured to supply power to the plurality of display modules,
    wherein the power board is arranged on a lower side of the frame and electrically connected to the plurality of display modules through an open area of the frame.

15. The display apparatus of claim 14, wherein the plurality of micro-pixel controllers comprise:
    a plurality of first micro-pixel controllers which are aligned in the second direction, and are configured to receive the power from the power board and supply the voltage corresponding to the received power to micro-pixel controllers that are adjacent thereto in the first direction; and
    a plurality of second micro-pixel controllers configured to receive the voltage from the plurality of first micro-pixel controllers or the micro-pixel controllers adjacent thereto in the direction opposite to the first direction.

16. The display apparatus of claim 11, wherein each micro-pixel controller of the plurality of micro-pixel controllers is further configured to convert the input voltage into the target voltage by increasing or decreasing the input voltage.

17. The display apparatus of claim 12, wherein each micro-pixel controller of the plurality of micro-pixel controllers is configured to convert a power voltage input from the one of the micro-pixel controllers into a target power voltage, and supply the target power voltage to the other micro-pixel controller.

18. The display apparatus of claim 17, wherein each micro-pixel controller of the plurality of micro-pixel controllers further comprises at least one pixel circuit comprising the at least one TFT to supply the driving current to the plurality of inorganic LEDs forming the at least two pixels, and supply the target power voltage to the at least one pixel circuit.

19. The display apparatus of claim 12, wherein each micro-pixel controller of the plurality of micro-pixel controllers is further configured to convert a reference voltage input from the one of the micro-pixel controllers into a target reference voltage and supply the target reference voltage to the other micro-pixel controller.

20. The display apparatus of claim 19, wherein each micro-pixel controller of the plurality of micro-pixel controllers is further configured to supply the target reference voltage to the plurality of inorganic LEDs forming the two or more pixels.

* * * * *